United States Patent
Chang et al.

(10) Patent No.: US 11,776,587 B2
(45) Date of Patent: Oct. 3, 2023

(54) POWER RAMPING SEQUENCE CONTROL FOR A MEMORY DEVICE

(71) Applicant: Taiwan Semiconductor Manufacturing Company, Ltd., Hsinchu (TW)

(72) Inventors: Yi-Ching Chang, Taichung (TW); Yangsyu Lin, New Taipei (TW); Yu-Hao Hsu, Tainan (TW); Cheng Lee, Hsinchu (TW)

(73) Assignee: Taiwan Semiconductor Manufacturing Company, Ltd.

( * ) Notice: Subject to any disclaimer, the term of this patent is extended or adjusted under 35 U.S.C. 154(b) by 0 days.

(21) Appl. No.: 17/522,556

(22) Filed: Nov. 9, 2021

(65) Prior Publication Data

US 2022/0254385 A1    Aug. 11, 2022

Related U.S. Application Data

(60) Provisional application No. 63/148,401, filed on Feb. 11, 2021.

(51) Int. Cl.
*G11C 5/14* (2006.01)

(52) U.S. Cl.
CPC .................... *G11C 5/148* (2013.01)

(58) Field of Classification Search
CPC ......... G11C 5/148; G11C 5/025; G11C 5/147; G11C 11/417; G11C 11/41; G11C 11/413
See application file for complete search history.

(56) References Cited

U.S. PATENT DOCUMENTS

| | | | | |
|---|---|---|---|---|
| 9,191,007 B1* | 11/2015 | Choy | ............ | H03K 19/018507 |
| 9,349,457 B2* | 5/2016 | Kim | ............ | G11C 16/08 |
| 9,417,675 B2 | 8/2016 | Tran et al. | | |
| 9,728,232 B2 | 8/2017 | Chhabra | | |
| 10,127,991 B2 | 11/2018 | Tanzawa | | |
| 10,439,827 B2* | 10/2019 | Lin | ............ | G06F 21/73 |
| 10,972,079 B2* | 4/2021 | Chen | ............ | H03K 5/003 |
| 11,073,551 B2 | 7/2021 | He et al. | | |
| 2016/0225438 A1* | 8/2016 | Kulkarni | ............ | G11C 11/419 |
| 2020/0007085 A1* | 1/2020 | Hsieh | ............ | H03F 3/005 |

FOREIGN PATENT DOCUMENTS

| | | |
|---|---|---|
| CN | 106463159 B | 3/2019 |
| TW | 202013544 A | 4/2020 |

\* cited by examiner

*Primary Examiner* — Khamdan N. Alrobaie

(74) *Attorney, Agent, or Firm* — Merchant & Gould P.C.

(57) ABSTRACT

Memory devices are disclosed that support multiple power ramping sequences or modes. For example, a level shifter device is operably connected to a memory macro in a memory device. The level shifter device receives at least one gating signal. Based on a state of the at least one gating signal, the level shifter device outputs one or more signals that cause or control voltage signals in or received by the memory macro to ramp up, ramp down, or ramp up and ramp down according to one or more power ramping modes.

20 Claims, 18 Drawing Sheets

POWER RAMPING SEQUENCE CONTROL FOR A MEMORY DEVICE

PRIORITY CLAIM AND CROSS-REFERENCE

The present application claims the benefit of U.S. Provisional Patent Application No. 63/148,401 titled "POWER RAMPING SEQUENCE CONTROL FOR A MEMORY DEVICE" filed on Feb. 11, 2021, of which the entire disclosure is hereby incorporated by reference in its entirety.

BACKGROUND

Memory devices are composed of large arrays of individual memory cells. One example of a memory device is a static random-access memory (SRAM). Each memory cell in the memory device can store a "1" or a "0" bit of data as an electrical high or low voltage state. Conventionally, eight (8) bits compose a byte of data. In each memory operation cycle, at least one byte is typically written into or read from the array. Memory cells are arranged at the crossings of vertical data lines (or bit-lines) and horizontal word-lines (or address lines). The word-lines enable the read or the write operations. A read or write cycle occurs when a word-line, as well as a bit line, or a pair of bit-lines, is/are activated.

Some power management schemes for memory devices only support ramping up one power source first. For example, a power management scheme may only support a power ramping sequence that ramps up a VDD voltage signal first or a VDDM voltage signal first. In some memory devices, a power management circuit or controller supports or meets a specification for only one of the power ramping sequences.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
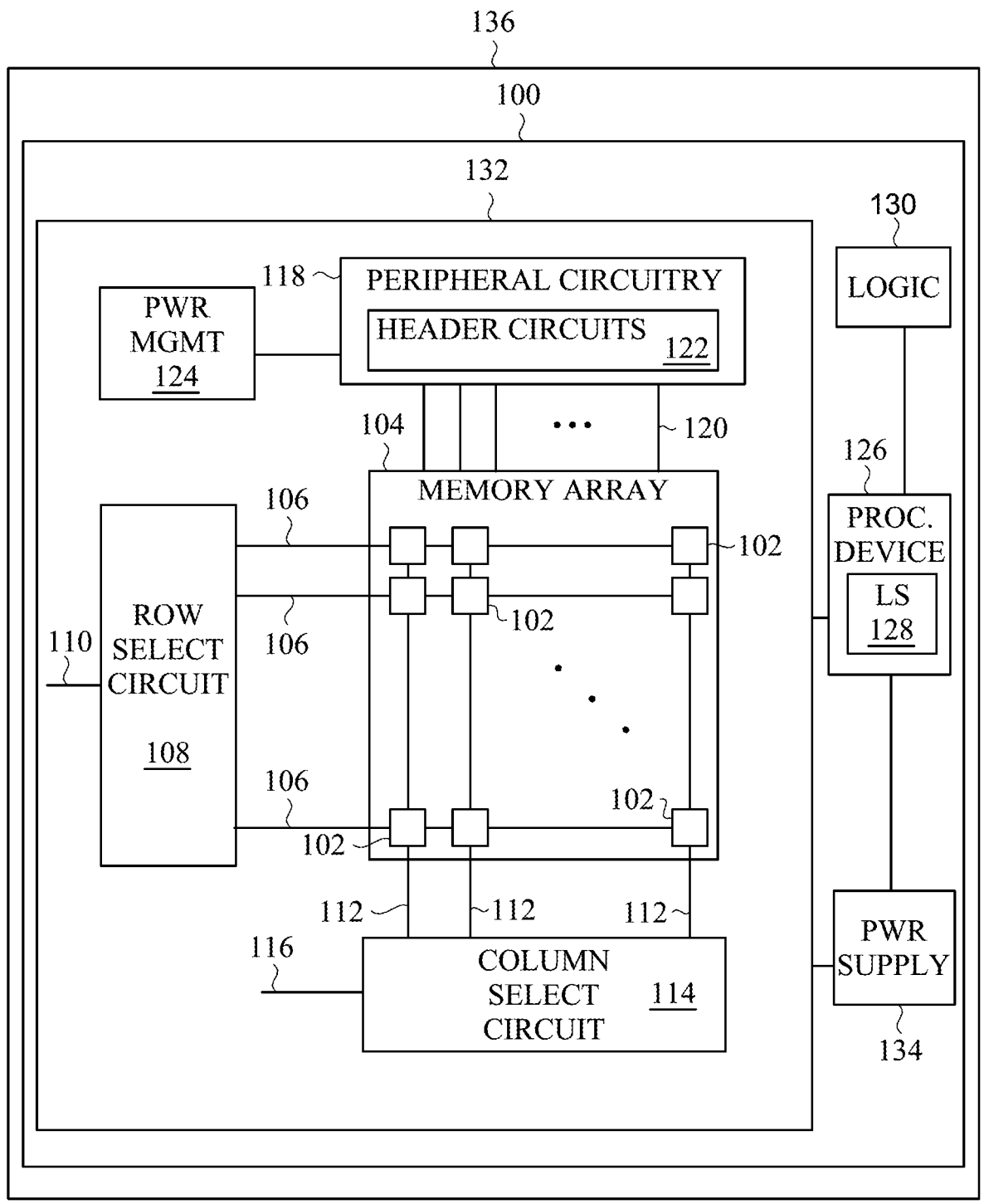
FIG. 1 illustrates a block diagram of an example memory device in which aspects of the disclosure may be practiced in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein provide memory devices that support multiple power ramping sequences. In a non-limiting embodiment, a circuit is operably connected to a memory macro in a memory device. One nonexclusive example of the circuit is a level shifter. Based on a state of at least one received gating signal, the circuit outputs one or more signals that cause voltage signals in or received by the memory macro to ramp up, ramp down, or ramp up and ramp down according to one or more power ramping sequences. A power ramping sequence is also referred to herein as a power ramping mode.

In one embodiment, a memory device supports two power ramping sequences simultaneously. Additionally or alternatively, a memory device supports a bulk off mode in which one or more power sources (e.g., VDD) are turned off when the memory macro is in the sleep mode. The bulk off mode saves an additional amount of power compared to the sleep mode and the shutdown mode. While in the bulk off mode, data can be retained in the memory array (e.g., one or more memory cells) by turning on (e.g., setting to a high signal level) a second voltage signal (e.g., VDDM) while the first voltage signal (e.g., VDD) is turned off.

These and other embodiments are discussed below with reference to FIGS. 1-18. However, those skilled in the art will readily appreciate that the detailed description given herein with respect to these Figures is for explanatory purposes only and should not be construed as limiting.

FIG. 1 illustrates a block diagram of an example memory device in which aspects of the disclosure may be practiced in accordance with some embodiments. The memory device 100 includes memory cells 102 that are arranged in rows and columns to form a memory array 104. The memory device 100 can include any suitable number of rows and columns. For example, a memory device includes R number of rows and C number of columns, where R is an integer greater than or equal or one and C is a number greater than or equal to one. Other embodiments are not limited to rows and columns of memory cells 102. The memory cells 102 in a memory array 104 can be organized in any suitable arrangement.

Each row of memory cells 102 is operably connected to one or more word lines (collectively word line 106). The word line 106 is operably connected to one or more row select circuits (collectively referred to as row select circuit 108). The row select circuit 108 selects a particular word line 106 based on an address signal that is received on signal line 110.

Each column of memory cells 102 is operably connected to one or more bit lines (collectively bit line 112). The bit line 112 is operably connected to one or more column select circuits (collectively referred to as column select circuit 114). The column select circuit 114 selects a particular bit line 112 based on a select signal that is received on signal line 116.

Peripheral circuitry 118 is operably connected to the memory array 104 via one or more signal lines (collectively signal line 120). The peripheral circuitry 118 may include components (e.g., semiconductor devices) for driving the devices of the memory array 104 and/or various devices operable to access and/or control the memory array 104. In a non-limiting example, the peripheral circuitry 118 includes devices that are used to perform read/write/erase operations in the memory cells 102 in the memory array 104. The devices include n-type transistors (e.g., n-FET) and p-type transistors (e.g., p-FET). The transistors may be configured as planar transistors or multi-gate transistors such as fin-type multi-gate transistors (FinFET transistors), although embodiments are not limited to this implementation.

In one embodiment, the peripheral circuitry 118 includes header circuits 122 that are used to gate the supply of power signals (e.g., VDD and VDDM) to the memory array 104. When data is to be written to a memory cell 102 (e.g., the memory cell 102 is programmed), or when data is to be read from a memory cell 102, an address for the memory cell 102 is received on signal line 110. A select signal is received on the signal line 116 and the bit line 112 associated with the memory cell 102 to be accessed (read or write) is precharged by the peripheral circuitry 118 (e.g., by activating or deactivating respective header circuits 122). When the bit line 112 is precharged, the row select circuit 108 activates or asserts the word line 106 associated with the address. The data is then written to, or read from, the memory cell 102.

Power management circuitry 124 includes power management circuits that are operably connected to various components in the memory device 100. In one embodiment, the power management circuitry 124 is operably connected to the header circuits 122 and to a processing device 126. A level shifter (LS) device 128 is implemented in the processing device 126. As will be described in more detail later, the level shifter device 128 receives signals from logic circuitry 130 and responsively produces signals that are received by the power management circuitry 124. The power management circuitry 124 causes voltage signals in or received by the memory macro 132 to ramp up, ramp down, or ramp up and ramp down according to one or more power ramping sequences.

The processing device 126 is operably connected to the memory macro 132. In the example embodiment, the memory macro 132 is a memory unit that includes various components of the memory device 100. In the illustrated embodiment, the memory macro 132 includes the memory array 104, the row select circuit 108, the column select circuit 114, the peripheral circuitry 118, and the power management circuitry 124. Within the memory macro 132, the processing device 126 can be operably connected to at least one of the memory array 104, the row select circuit 108, the column select circuit 114, the peripheral circuitry 118, and the power management circuitry 124. In a non-limiting example, the memory device 100, the memory macro 132 or the memory array 104 is implemented as a static random-access memory device/macro/array.

The processing device 126 is operable to control one or more operations of the memory array 104, the row select circuit 108, the column select circuit 114, the peripheral circuitry 118, and/or the power management circuitry 124. Any suitable processing device can be used. Example processing devices include, but are not limited to, a central processing unit, a microprocessor, an application specific integrated circuit, a graphics processing unit, a field programmable gate array, or combinations thereof.

A power supply 134 is operably connected to the memory macro 132 and to the processing device 126. In some embodiments, the power supply 134 is operably connected to the memory array 104, the row select circuit 108, the column select circuit 114, the peripheral circuitry 118, and the power management circuitry 124. In the illustrated embodiment, the processing device 126 and the power supply 134 are positioned outside of the memory macro 132. In another embodiment, the processing device 126 and/or the power supply 134 can be disposed within the memory macro 132. In still another embodiment, the processing device 126 and/or the power supply 134 may be disposed in separate circuitry and operably connected to the memory device 100.

The memory device 100 is included in an electronic device 136. The electronic device 136 can be any suitable electronic device. Example electronic devices include, but are not limited to, a computing device such as a laptop computer and a tablet, a cellular telephone, a television, an automobile, a stereo system, and a camera.

Figure 2:
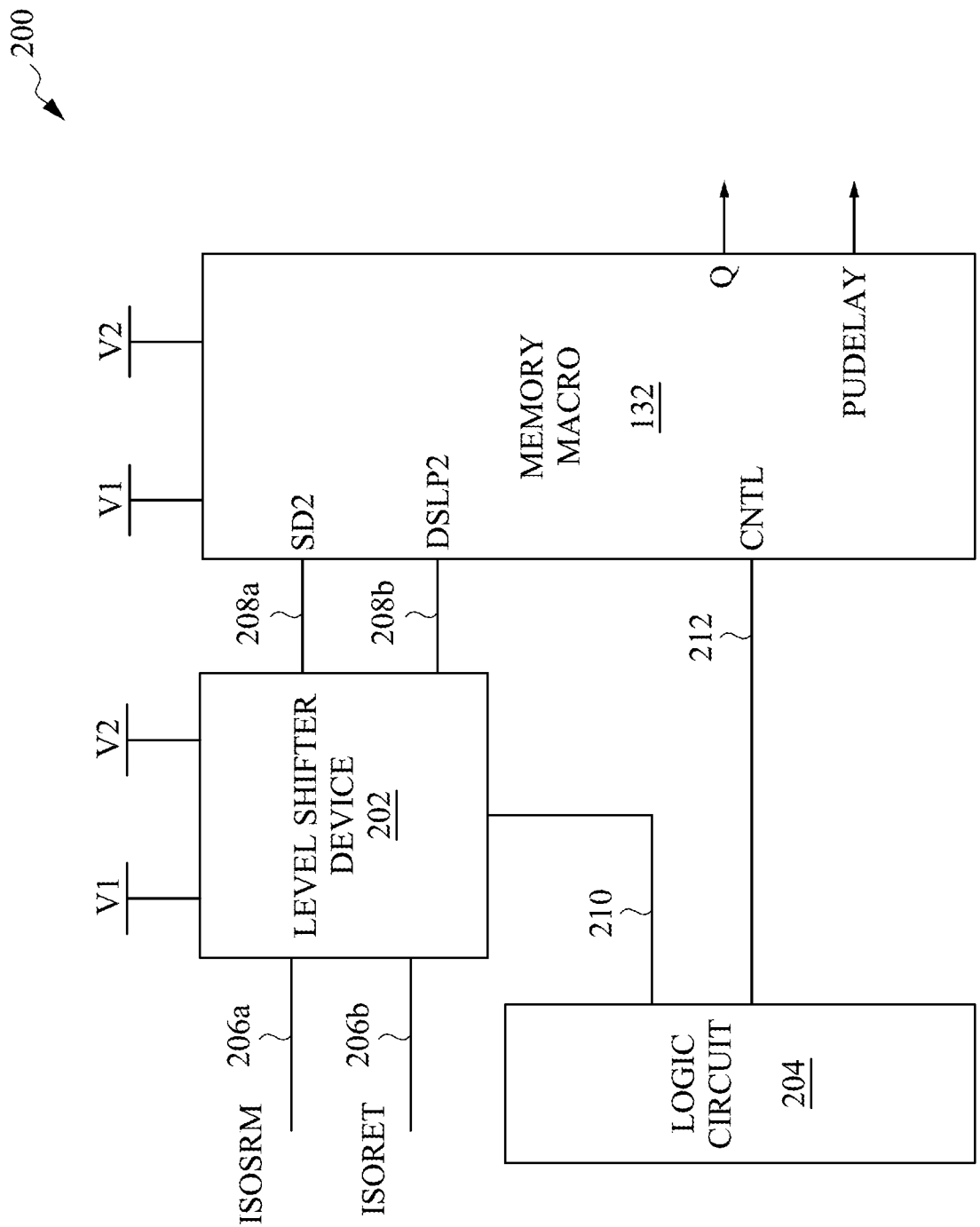
FIG. 2 illustrates a block diagram of an example ramping control system in accordance with some embodiments.

FIG. 2 illustrates a block diagram of an example ramping control system in accordance with some embodiments. The ramping control system 200 includes the memory macro 132, a level shifter device 202 operably connected to the memory macro 132, and a logic circuit 204 operably connected to the level shifter device 202 and to the memory macro 132. The level shifter device 202 is the level shifter device 128 shown in FIG. 1. The logic circuit 204 is any suitable logic circuit or circuits. For example, the logic circuit 204 is an inverter or a buffer in some embodiments.

In one embodiment, the level shifter device 202 operates at an interface between the circuitry of a first voltage V1 (referred to herein as a V1 domain) and the circuitry of a second voltage V2 (referred to herein as a V2 domain). For example, the V1 domain can be a VDD domain and the V2 domain may be a VDDM domain. One or more level shifter circuits in the level shifter device 202 are configured to receive one or more gating signals (e.g., an ISOSRM signal on signal line 206a) and one or more input signals in the V1 domain (e.g., an SD1 signal on signal line 210) and output one or more signals in the V2 domain (e.g., an SD2 signal). The signal(s) in the V2 domain are used to control the ramping up and ramping down of the V1 and the V2 signals in the memory macro 132. Example level shifter circuits are described in more detail in conjunction with FIGS. 4, 5, and 7.

In one embodiment, the level shifter device 202 is operable to receive the gating signal ISOSRM on signal line 206a. In another embodiment, the level shifter device 202 is operable to receive the gating signal ISOSRM on signal line 206a and a gating signal ISORET on signal line 206b. The ISOSRM signal and the ISORET signal can be generated by a processing device (e.g., processing device 126 using logic circuitry 130 shown in FIG. 1).

Figure 4:
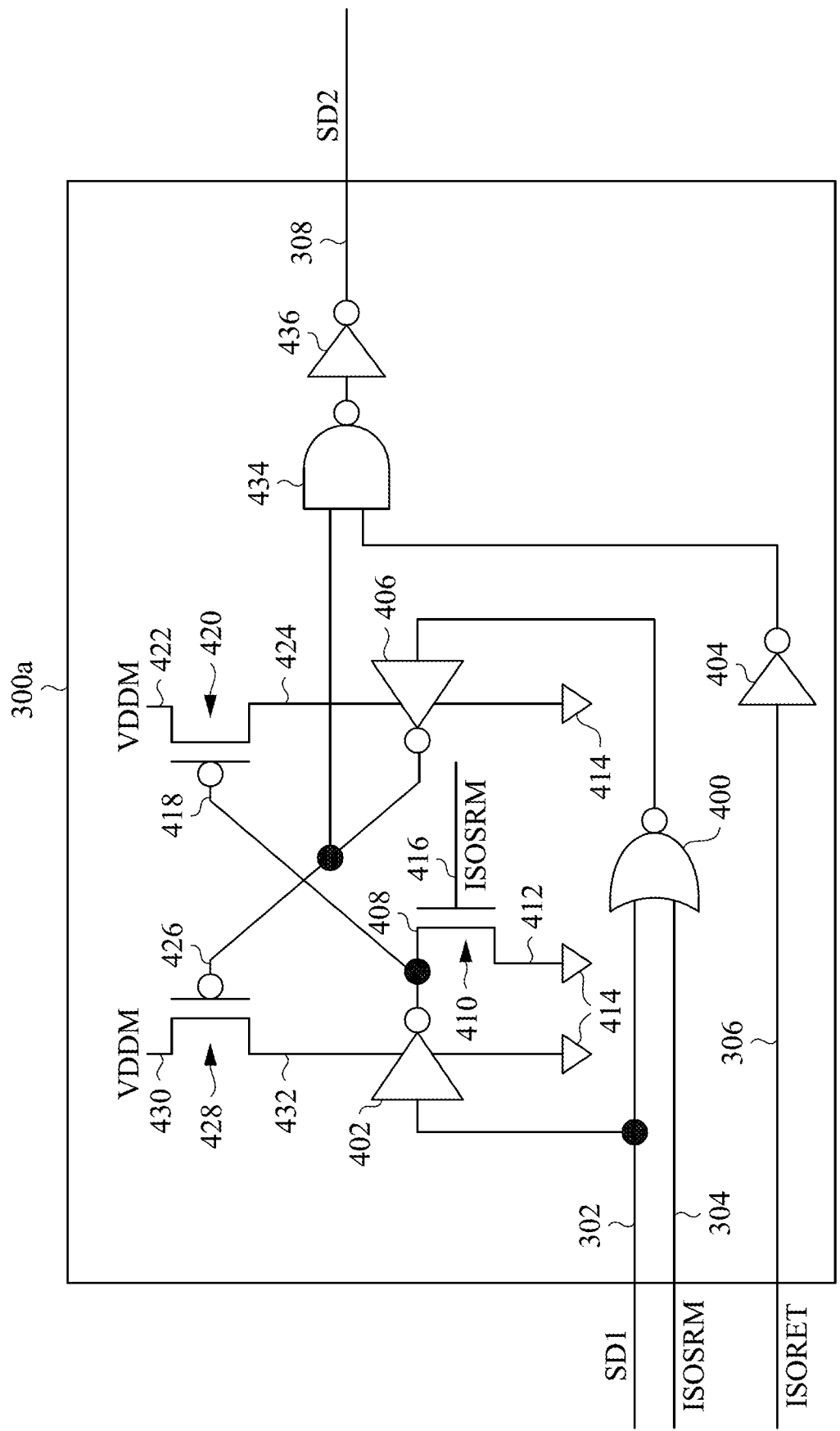
FIG. 4 illustrates a schematic diagram of a first example of the level shifter circuit shown in FIG. 3 in accordance with some embodiments.
Figure 5:
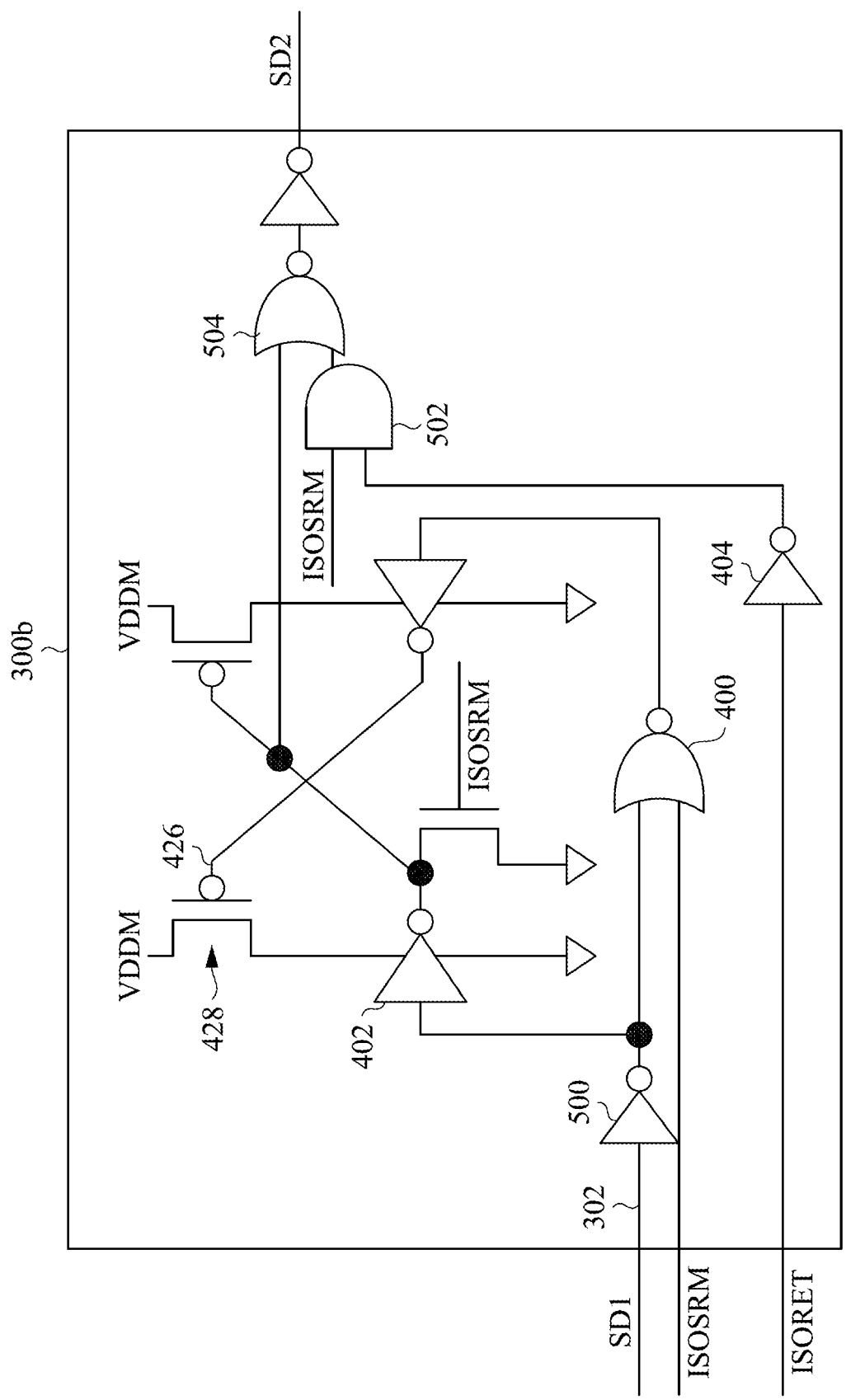
FIG. 5 illustrates a schematic diagram of a second example of the level shifter circuit shown in FIG. 3 in accordance with some embodiments.

Based on the states or signal levels of the gating signal ISOSRM and the gating signal ISORET, a level shifter circuit in the level shifter device 202 outputs a signal SD2 on signal line 208a. Non-limiting and nonexclusive example level shifter circuits are shown in FIGS. 4 and 5. Table 1 is a truth table for the level shifter circuits of FIGS. 4 and 5 that illustrates the signal levels of the SD2 signal based on the various signal levels of the ISOSRM signal, the ISORET signal, and the SD1 signal.

Figure 7:
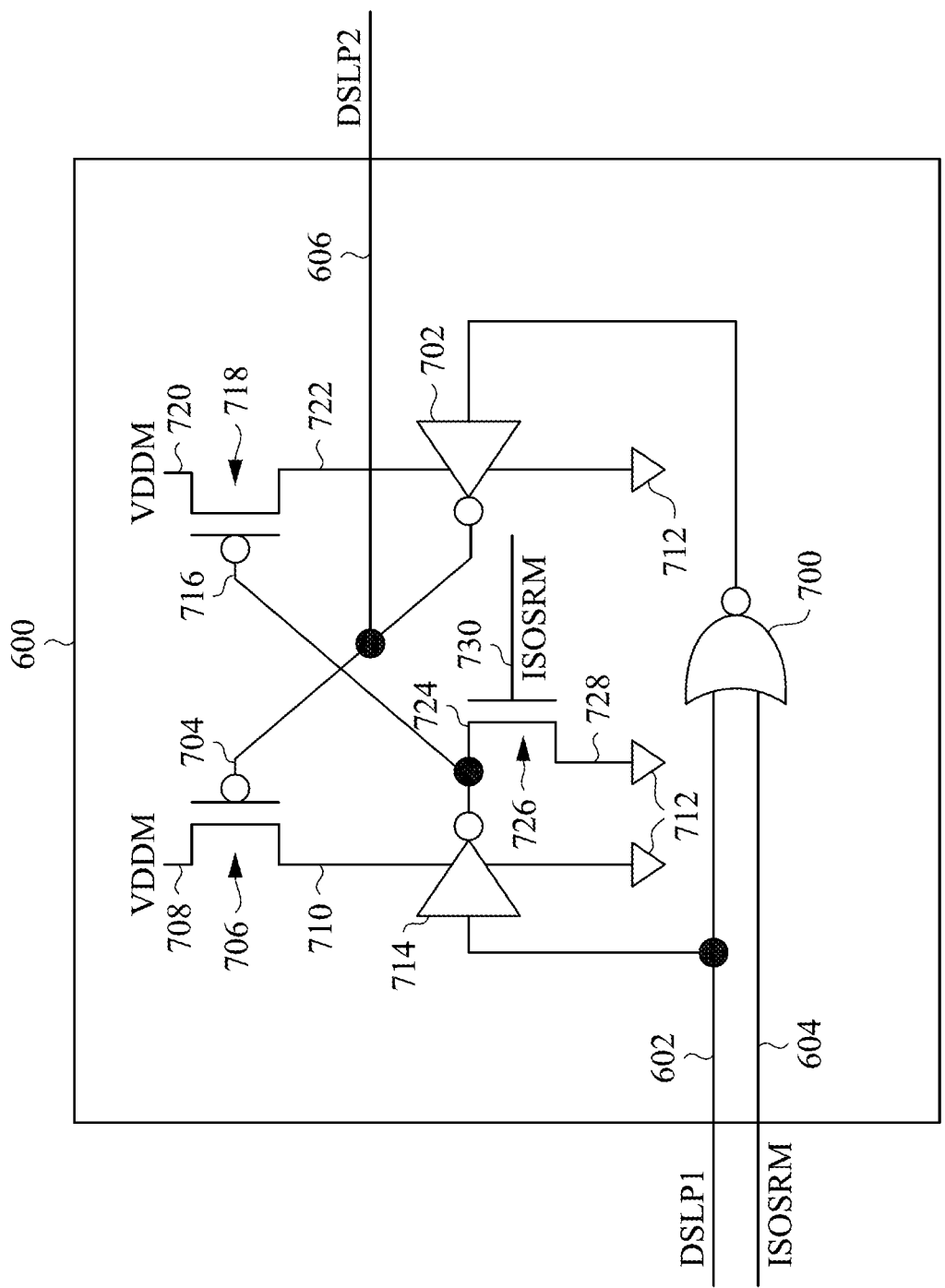
FIG. 7 illustrates a schematic diagram of an example level shifter circuit that is suitable for use in the level shifter device shown in FIG. 6 in accordance with some embodiments.

In embodiments where the level shifter device 202 receives the gating signal ISOSRM, the level shifter device outputs the signal DSLP2 on signal line 208b. A non-limiting and nonexclusive example level shifter circuit is shown in FIG. 7. Table 4 is a truth table for the level shifter circuit of FIG. 7 that illustrates the signal levels of the DSLP2 signal based on the various signal levels of the ISOSRM signal and the SD1 signal.

The SD2 and DSLP2 signals are in the V2 domain and produce different power saving modes in the memory macro 132. In one embodiment, the SD2 signal is associated with a shutdown mode that turns off power (e.g., voltage) to components in the peripheral circuitry and the memory array while leaving one or more power sources (e.g., VDD, VDDM) turned on. The DSLP2 signal is associated with a sleep mode that turns off power to some of the components in the peripheral circuits, while leaving one or more power sources (e.g., VDD, VDDM) turned on. A third power saving mode is a bulk off mode that is configured to turn off one or more power sources (e.g., VDD) when the memory macro 132 is in the sleep mode. The bulk off mode saves an additional amount of power. The signal SD2 or the signals SD2 and DSLP2 also cause the V1 and the V2 voltage signals in or received by the memory macro 132 to ramp up, ramp down, or ramp up and ramp down according to one or more power ramping sequences. A power ramping sequence is also referred to herein as a power ramping mode.

The logic circuit 204 outputs one or more signals on signal line 210 that are received by the level shifter device 202. Example signals that can be received by the level shifter device 202 include, but are not limited to, a shutdown signal SD1 and a sleep signal DSLP1. The SD1 and the DSLP1 signals are produced in the V1 domain.

The logic circuit 204 also outputs one or more signals on signal line 212 that are received by the memory macro 132. Example signals that can be received by the memory macro 132 include, but are not limited to, control signals such as a clock signal, a chip enable signal, a write enable signal, and an address signal.

An output signal Q and an output signal PUDELAY are output from the memory macro 132. The signal level or state of the output signal Q represents a data value in one or more memory cells. The output signal PUDELAY represents a start-up or power up delay signal that is propagated to other memory macros in a memory device. The output signal PUDELAY is used for sequential wake-up control on multiple macros to reduce simultaneous peak current at the chip level.

In a non-limiting example, the V1 signal is the VDD voltage signal and the V2 signal is the VDDM voltage signal. In this example embodiment, the level shifter device 202 outputs one or more signals on signal line 208a and/or signal line 208b that cause the V1 voltage signal and the V2 voltage signal in or received by the memory macro 132 to ramp up, ramp down, or ramp up and ramp down according to one or more power ramping modes. For example, as shown in Table 2, when a signal level or a state of the ISOSRM signal is at a first signal level or first logic state, a first power ramping mode ramps up the VDD voltage signal before the VDDM voltage signal is ramped up and ramps down the VDD voltage signal after the VDDM voltage signal is ramped down. When a signal level of the ISOSRM signal is at a second signal level or a second logic state, a second power ramping mode ramps up the VDDM voltage signal before the VDD voltage signal is ramped up and ramps down the VDDM voltage signal after the VDD voltage signal is ramped down. In another embodiment, the first power ramping mode ramps up the VDD voltage signal prior to ramping up the VDDM voltage signal and the second power ramping mode ramps up the VDDM voltage signal prior to ramping up the VDD voltage signal.

Figure 3:
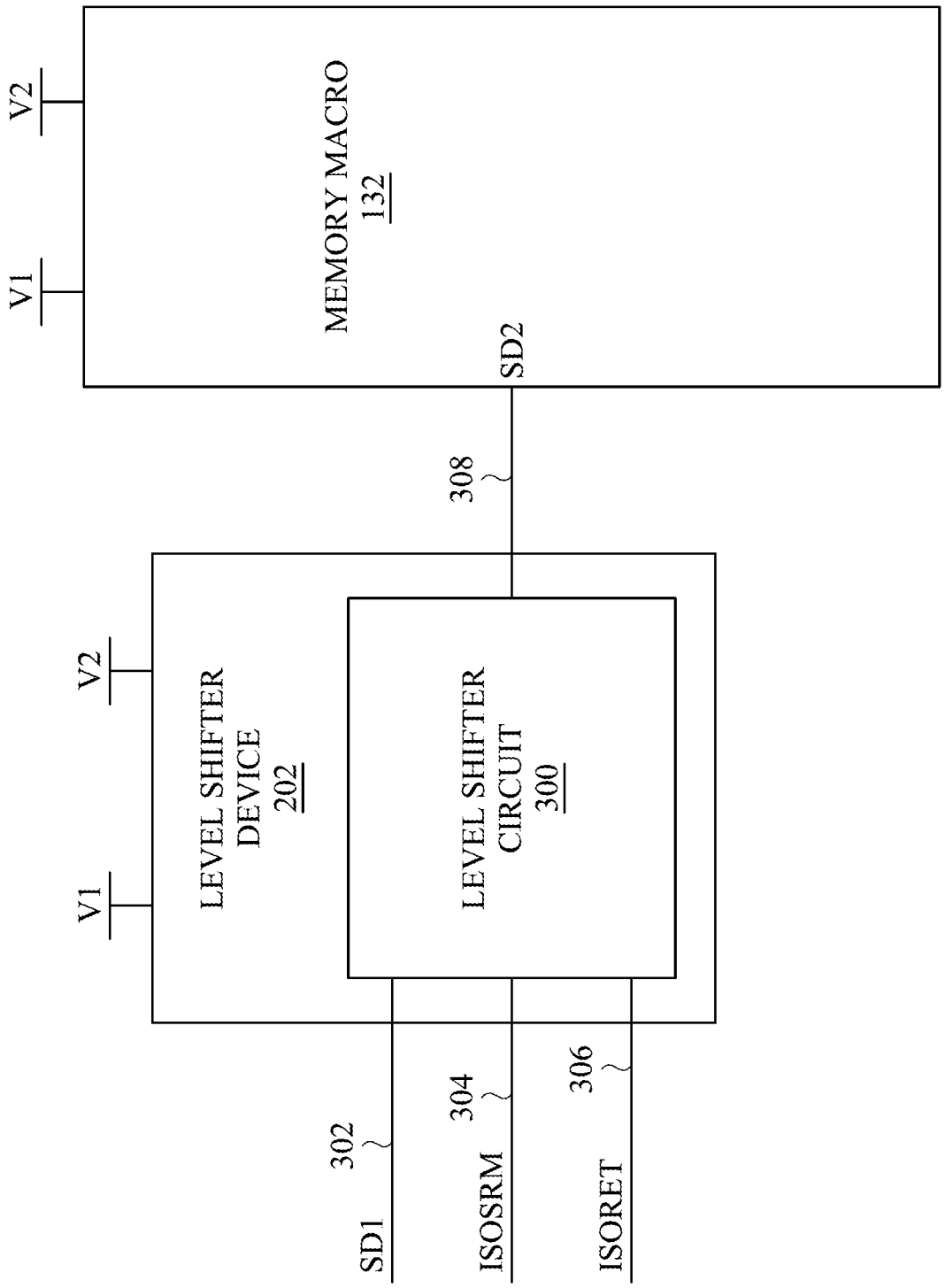
FIG. 3 illustrates a block diagram of a first example of a level shifter device operably connected to a memory macro in accordance with some embodiments.

FIG. 3 illustrates a block diagram of a first example of a level shifter device operably connected to a memory macro in accordance with some embodiments. The level shifter device 202 includes a level shifter circuit 300. The level shifter circuit 300 receives a shutdown (SD1) signal in the V1 domain and outputs a shutdown signal (SD2) in the V2 domain. The level shifter circuit 300 receives the SD1 signal on signal line 302, the gating signal (ISOSRM signal) on signal line 304, and the gating signal (ISORET signal) on signal line 306. The level shifter circuit 300 outputs the SD2 signal on signal line 308. The SD2 signal is received by the memory macro 132 (e.g., the power management circuitry 124 in FIG. 1) and is used to cause the V1 and V2 signals in the memory macro 132 to ramp up and ramp down according to one or more power ramping modes.

As discussed earlier, in a non-limiting embodiment, a ramping control system supports two power ramping modes. One power ramping mode is referred to herein as a DL mode and the other power ramping mode as a DM mode. Both the DL mode and the DM mode cause a respective first voltage signal to ramp up first and a respective second voltage signal to ramp up second (after the first voltage signal), and the respective second voltage signal to ramp down first and the respective first voltage signal to ramp down second (after the second voltage signal). For example, in the DL mode, a V1 signal, such as a VDD voltage signal, ramps up earlier and ramps down later than a V2 signal (e.g., a VDDM voltage signal). In the DM mode, the V2 signal (e.g., the VDDM voltage signal) ramps up earlier and ramps down later than the V1 signal (e.g., the VDD voltage signal). In one embodiment, the ISOSRM signal is configured to switch the power ramping modes between the DL mode and the DM mode, and the ISORET signal is configured to produce an optional bulk off mode in the memory macro 132. As described earlier, the bulk off mode is an additional power saving mode that is configured to turn off a power source (e.g., V1) when the memory macro is in a sleep mode.

FIG. 4 illustrates a schematic diagram of a first example of the level shifter circuit shown in FIG. 3 in accordance with some embodiments. The depicted level shifter circuit 300a is operable to receive the SD1 signal in the V1 domain and output the SD2 signal in the V2 domain. In the illustrated embodiment, the SD1 signal on signal line 302 and the ISOSRM signal on signal line 304 are input into a NOR gate 400. The SD1 signal is also input into an inverter 402. The ISORET signal on signal line 306 is input into an inverter 404. As described earlier, the ISOSRM signal is operable to switch the power ramping modes in a memory macro between the DL and the DM modes and the ISORET signal is configured to produce a bulk off mode in the memory macro 132.

The output of the NOR gate 400 is input into an inverter 406. The output of the inverter 402 is connected to a terminal 408 of a transistor 410. One example of a transistor 410 is an n-type transistor (e.g., an NMOS transistor), although other embodiments are not limited to this type of transistor. The other terminal 412 of the transistor 410 is connected to a reference voltage 414. One example of the reference voltage 414 is ground. The ISOSRM signal is an input signal to the gate 416 of the transistor 410.

The output of the inverter 402 is also connected to a gate 418 of a transistor 420. One example of a transistor 420 is a p-type transistor (e.g., a PMOS transistor), although other embodiments are not limited to this type of transistor. A terminal 422 of the transistor 420 is connected to a V2 voltage source. In the representative embodiment, the V2 voltage source is the VDDM voltage source. The other terminal 424 of the transistor 420 is connected to the reference voltage 414.

The output of the inverter 406 is connected to a gate 426 of another transistor 428. In the illustrated embodiment, the transistor 428 is a p-type transistor. A terminal 430 of the transistor 428 is connected to the V2 voltage source. The other terminal 432 of the transistor 420 is connected to the reference voltage 414.

The output of the inverter 404 and the output of the inverter 406 are input into a NAND gate 434. The output of the NAND gate 434 is input into an inverter 436. The SD2 signal is output from the inverter 436 on signal line 308. As discussed in more detail later, Table 1 depicts a truth table for the level shifter circuit 300a that shows the various signal levels of the ISOSRM, ISORET, SD1, and SD2 signals.

FIG. 5 illustrates a schematic diagram of a second example of the level shifter circuit shown in FIG. 3 in accordance with some embodiments. The level shifter circuit 300b shown in FIG. 5 is similar to the level shifter circuit 300a illustrated in FIG. 4 except for the omission of the NAND gate 434 and the addition of an inverter 500, an AND gate 502, and a NOR gate 504. Like the level shifter circuit 300a in FIG. 4, the illustrated level shifter circuit 300b is operable to output the SD2 signal in the V2 domain. The ISOSRM signal is operable to switch the power ramping modes in a memory macro between the DL and the DM modes and the ISORET signal is configured to produce a bulk off mode in the memory macro 132.

The SD1 signal on signal line 302 is input into the inverter 500, and the output of the inverter 500 is input into the inverter 402 and into the NOR gate 400. The output of the inverter 404 and the ISOSRM signal are input into the AND gate 502. In the illustrated embodiment, the output of the AND gate 502 and the output of the inverter 402 are input into the NOR gate 504. Unlike the embodiment shown in FIG. 4, the output of the inverter 406 is connected to only the gate 426 of the transistor 428. The output of the inverter 406 is not input into the NAND gate 434 since the NAND gate 434 is omitted in the embodiment depicted in FIG. 5.

As described earlier, the depicted level shifter circuits 300a, 300b are operable to receive the SD1 signal in the V1 domain and output the SD2 signal in the V2 domain. In one embodiment, the level shifter circuits 300a, 300b shown in FIGS. 4 and 5 operate using the truth table shown in TABLE 1.

TABLE 1

| ISOSRM | ISORET | SD1 | SD2 |
|---|---|---|---|
| 0 | 0 | 0 | 0 |
| 0 | 0 | 1 | 1 |
| 0 | 1 | 0 | 0 |
| 0 | 1 | 1 | 1 |
| 1 | 0 | 0 | 1 |
| 1 | 0 | 1 | 1 |
| 1 | 1 | 0 | 0 |
| 1 | 1 | 1 | 0 |

Figure 6:
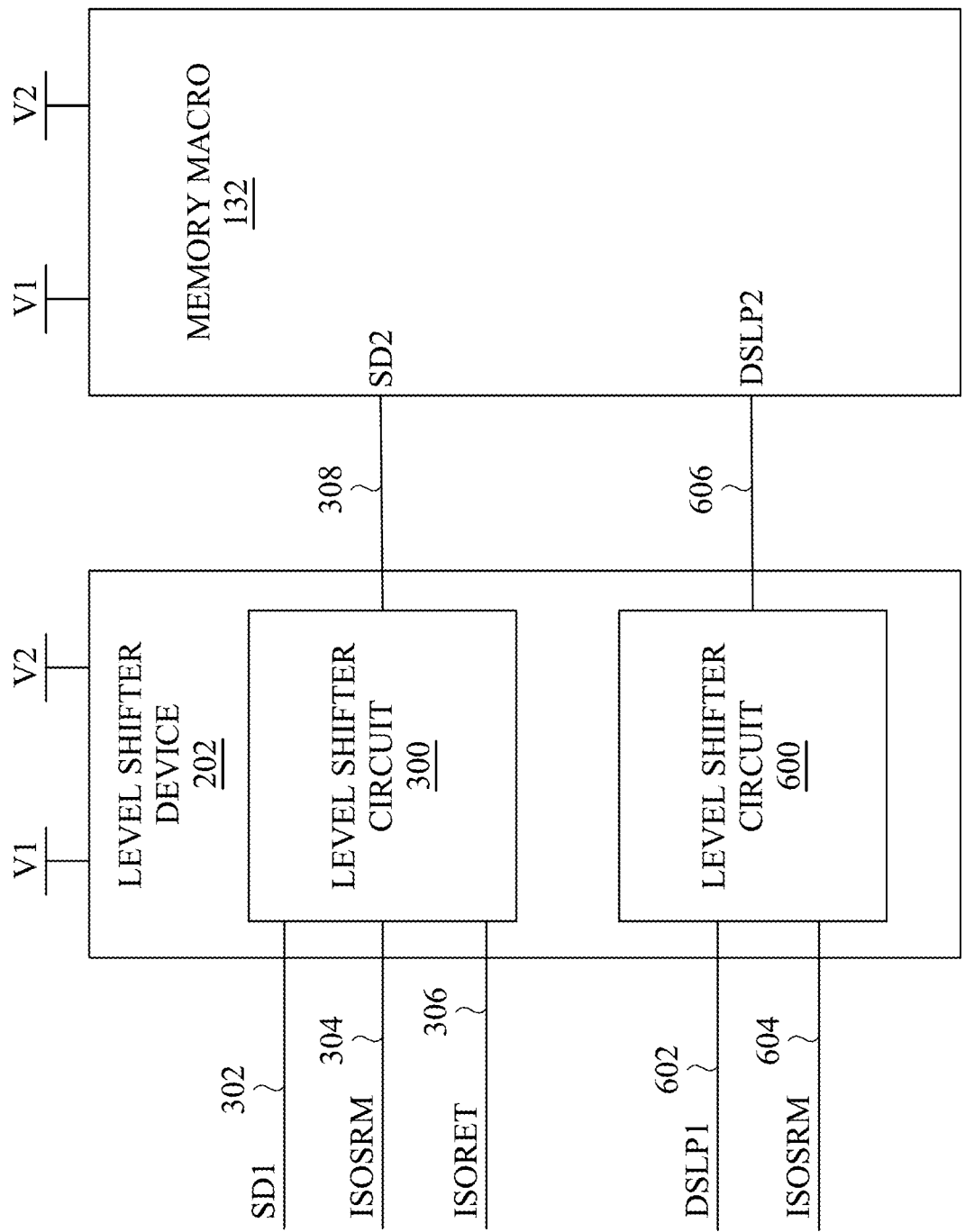
FIG. 6 illustrates a block diagram of a second example of a level shifter device operably connected to a memory macro in accordance with some embodiments.

FIG. 6 illustrates a block diagram of a second example of a level shifter device operably connected to a memory macro in accordance with some embodiments. The level shifter device 202 includes a level sifter circuit 600 and the level shifter circuit 300 shown in FIG. 3. For brevity, the description of the level shifter circuit 300 is not repeated here.

The level shifter circuit 300 is operable to receive a SD1 signal generated in the V1 domain and output the SD2 signal in the V2 domain. The level shifter circuit 600 is operable to receive a DSLP1 signal produced in the V1 domain and output the DSLP2 signal in the V2 domain. The level shifter circuit 600 receives the sleep signal (DSLP1 signal) on signal line 602 and the gating signal ISOSRM on signal line 604. The signal line 604 can be the same signal line as the signal line 304 or the signal line 604 may be a signal line that is distinct from the signal line 304. The level shifter circuit 600 outputs the SD2 signal on signal line 308 and the DSLP2 signal on signal line 606. The SD2 and the DSLP2 signals are received by the memory macro 132 (e.g., the power management circuitry 124 in FIG. 1). The SD2 and the DSLP2 signals cause the V1 and V2 signals in the memory macro 132 to ramp up and ramp down according to one or more power ramping modes.

In a non-limiting embodiment, the level shifter circuits 300, 600 provide control for multiple power ramping modes. In the DL mode, the V1 signal, such as a VDD voltage signal, ramps up earlier and ramps down later than the V2 signal (e.g., a VDDM voltage signal). In the DM mode, the V2 signal (e.g., the VDDM voltage signal) ramps up earlier and ramps down later than the V1 signal (e.g., the VDD voltage signal). As described earlier, in one embodiment, the ISOSRM signal is configured to switch the power ramping modes between the DL mode and the DM mode, and the ISORET signal is configured to produce an optional bulk off mode in the memory macro 132.

In the illustrated embodiment, the level shifter circuit 600 receives one gating signal, the ISOSRM signal. Table 2 is an example mode support table for the level sifter circuit 600.

TABLE 2

| ISOSRM | MODE SUPPORT |
| --- | --- |
| 0 | V1 ramp up/down |
| 1 | V2 ramp up/down |

When the ISOSRM signal is at a low signal level, the V1 signal ramps up before the V2 signal and ramps down after the V2 signal ramps down (e.g., the DL mode). When the ISOSRM signal is at a high signal level, the V2 signal ramps up before the V1 signal and ramps down after the V1 signal ramps down (e.g., the DM mode).

In other embodiments, a level shifter circuit (e.g., level shifter circuit 300a, 300b in FIGS. 4 and 5) receives two gating signals, the ISOSRM signal and the ISORET signal, along with the SD1 signal and the DSLP1 signal. Table 3 is an example mode support table for the level sifter circuit.

TABLE 3

| ISOSRM | ISORET | SD2 SIGNAL | DSLP2 SIGNAL | MODE SUPPORT |
| --- | --- | --- | --- | --- |
| 0 | 0 | SD1 Input | DSLP1 Input | V1 ramp up/down and V2 bulk off mode |
| 0 | 1 | SD1 Input | DSLP1 Input | V1 ramp up/down and V2 bulk off mode |
| 1 | 0 | 1 | 1 | V2 ramp up/down and V1 bulk off mode with data collapsed |
| 1 | 1 | 0 | 1 | V2 ramp up/down and V1 bulk off mode with data retained |

The phrase "data collapse" in Table 3 refers to the unpredictability of the data stored in the memory cells in the memory array. The phrase "data retained" means the data stored in the memory cells in the memory array are retained. When the ISOSRM signal is at a low signal level, the SD2 signal follows the input SD1 signal and the DSLP2 signal follows the input DSLP1 signal. Also, the V1 signal ramps up before the V2 signal ramps up and the V1 signal ramps down after the V2 signal ramps down. The V2 signal is in a bulk off mode.

When the ISOSRM signal is at a high signal level and the ISORET signal is at a low signal level, the SD2 signal and the DSLP2 signal are both at a high signal level. The V2 signal ramps up before the V1 signal ramps up and the V2 signal ramps down after the V1 signal ramps down. The V1 signal is in a bulk off mode with the data in one or more memory cells collapsed.

When the ISOSRM signal is at a high signal level and the ISORET signal is at a high signal level, the SD2 signal is at a low signal level and the DSLP2 signal is at a high signal level. The V2 signal ramps up before the V1 signal ramps up and the V2 signal ramps down after the V1 signal ramps down. The V1 signal is in a bulk off mode with the data in one or more memory cells retained.

FIG. 7 illustrates a schematic diagram of an example level shifter circuit that is suitable for use in the level shifter device shown in FIG. 6 in accordance with some embodiments. The level shifter circuit 600 receives the DSLP1 signal in the V1 domain and outputs the DSLP2 signal in the V2 domain. In the illustrated embodiment, the DSLP1 signal on signal line 602 and the ISOSRM signal on signal line 604 are input into a NOR gate 700. The ISOSRM signal is operable to switch the power ramping modes in a memory macro between the DL and the DM modes.

The output of the NOR gate 700 is input into an inverter 702, and the output of the inverter 702 is connected to a gate 704 of a transistor 706. One example of the transistor 706 is a p-type transistor (e.g., a PMOS transistor), although other embodiments are not limited to this type of transistor. A terminal 708 of the transistor 706 is connected to a V2 voltage source. In the representative embodiment, the V2 voltage source is the VDDM voltage source. The other terminal 710 of the transistor 706 is connected to a reference voltage 712. One example of the reference voltage 712 is ground.

The DSLP1 signal on signal line 602 is also input into an inverter 714. The output of the inverter 714 is connected to a gate 716 of another transistor 718. One example of the transistor 718 is a p-type transistor, such as a PMOS transistor. Other embodiments are not limited to this type of transistor. A terminal 720 of the transistor 718 is connected to the V2 voltage source. The other terminal 722 of the transistor 718 is connected to the reference voltage 712.

The output of the inverter 714 is also connected to a terminal 724 of a transistor 726. One example of the transistor 726 is an n-type transistor, such as a NMOS transistor. Other embodiments are not limited to this type of transistor. The other terminal 728 of the transistor 726 is connected to the reference voltage 712. The ISOSRM signal is an input signal to the gate 730 of the transistor 726.

As described earlier, the depicted level shifter circuit 600 is operable to receive the DSLP1 signal in the V1 domain and output the DSLP2 signal in the V2 domain. In one embodiment, the level shifter circuit 600 shown in FIG. 7 operates using the truth table shown in TABLE 4.

TABLE 4

| ISOSRM | DSLP1 | DSLP2 |
| --- | --- | --- |
| 0 | 0 | 0 |
| 0 | 1 | 1 |
| 1 | 0 | 1 |
| 1 | 1 | 1 |

Figure 8:
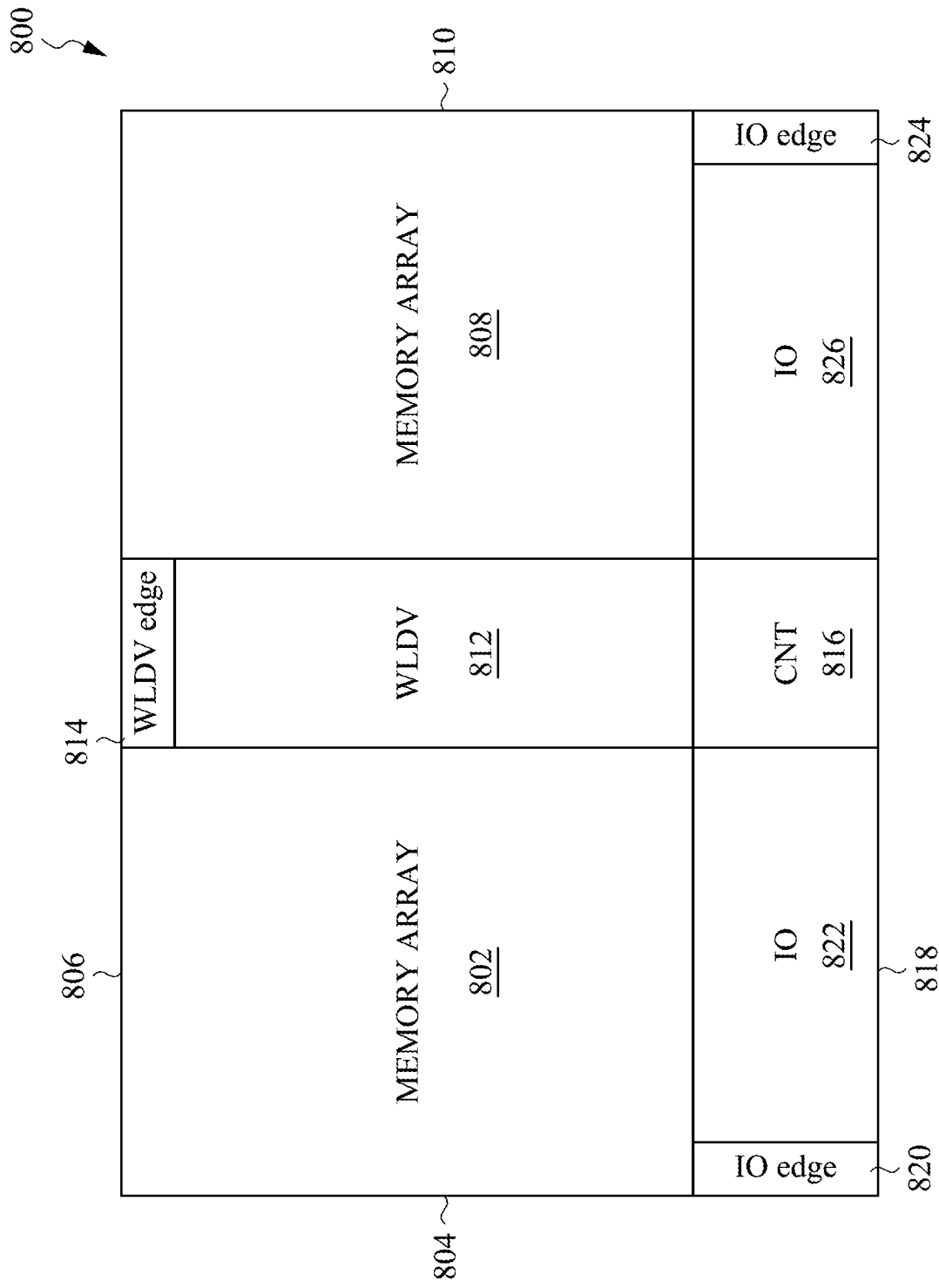
FIG. 8 illustrates a block diagram of a memory macro in accordance with some embodiments.

FIG. 8 illustrates a block diagram of an example memory macro in accordance with some embodiments. In one embodiment, the memory macro 800 is the memory macro 132 shown in FIG. 1. In some embodiments, multiple level shifter circuits can be used to produce signals that control the power ramping modes of the different areas or blocks of the memory macro 800. FIG. 14 illustrates a bock diagram of a level shifter device that includes four level shifter circuits. As will be described in more detail later, the outputs of the four level shifter circuits are input into respective power management circuits shown in FIGS. 10-13 to control the power ramping modes of the different blocks of the memory macro 800.

The example memory macro 800 includes a memory array block 802 positioned at the edges 804, 806 of the memory macro 800, a memory array block 808 disposed at the edges 806, 810 of the memory macro 800, and a word line driver (WLDV) block 812 that is positioned between the memory array blocks 802, 808. In one embodiment, the memory array blocks 802, 808 are implemented like the memory array 104 in FIG. 1.

A WLDV edge block 814 is disposed between the edge 806 and the WLDV block 812. A control (CNT) block 816 is positioned between the edge 818 of the memory macro 800 and the WLDV block 812. An input/output (IO) edge block 820 is disposed along the edge 804 and between the memory array block 802 and the edge 818. An IO block 822 is positioned along the edge 818 between the IO edge block 820 and the CNT block 816. Another IO edge block 824 is disposed along the edge 810 and between the memory array block 808 and the edge 818. Another IO block 826 is positioned along the edge 818 between the IO edge block 824 and the CNT block 816. In other embodiments, the arrangement of the blocks can be different from the arrangement shown in FIG. 8 and one or more blocks may be omitted or added.

Figure 9:
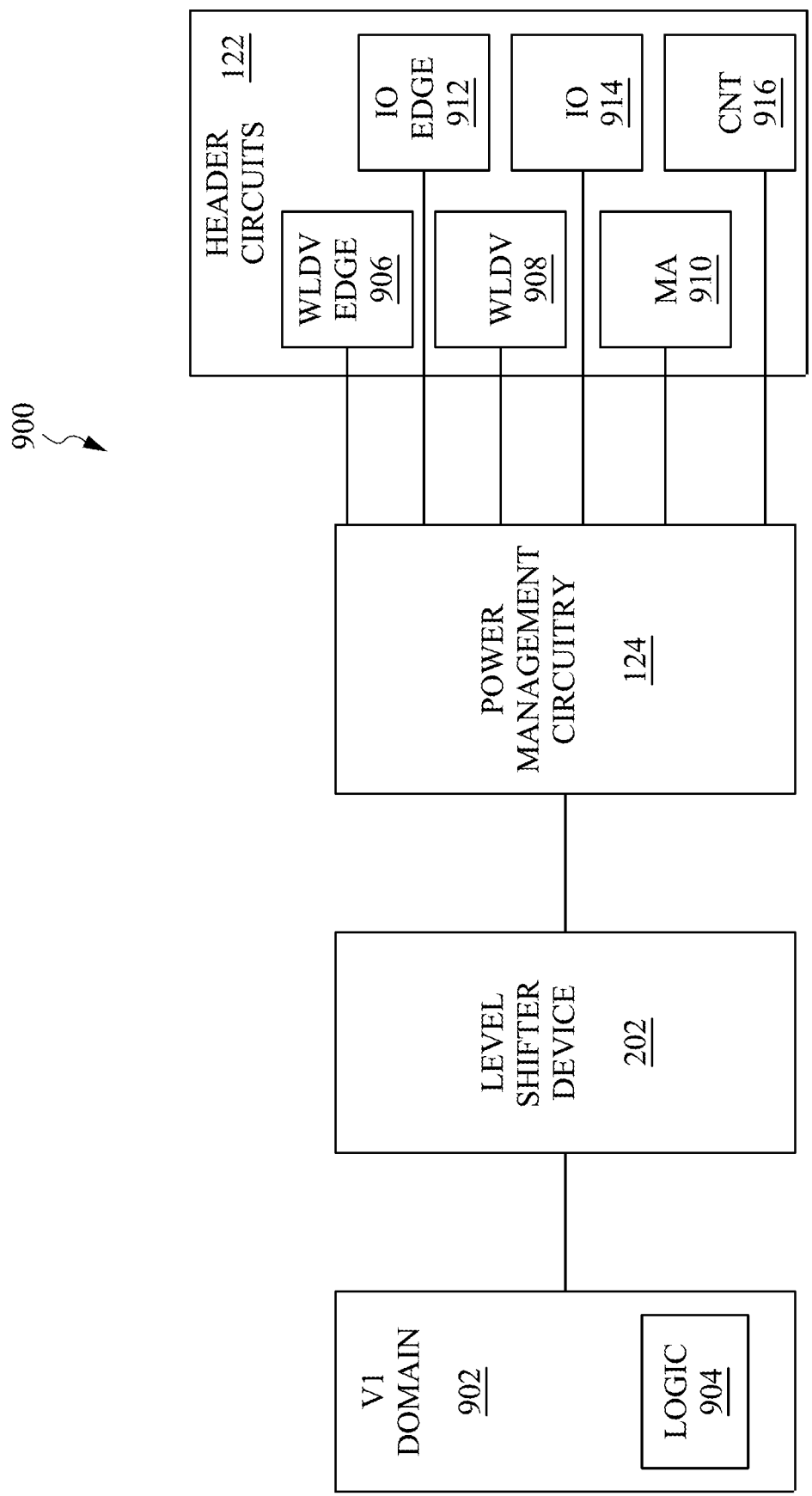
FIG. 9 illustrates a block diagram of a system for power ramping mode control in accordance with some embodiments.

FIG. 9 illustrates a block diagram of an example system for power ramping mode control in accordance with some embodiments. The system 900 includes the V1 domain 902, the level shifter device 202, a power management circuitry 124, and the header circuits 122. The V1 domain 902 includes circuitry (e.g., logic circuit 904) that is powered by and operate using the V1 voltage. In one embodiment, the logic circuit 904 is the logic circuitry 130 in FIG. 1. The logic circuit 904 provides data to a processing device (e.g., processing device 126 in FIG. 1) to cause one or more signals to be output by the V1 domain 902 that are received by the level shifter device 202. Example signals include, but are not limited to, the shutdown mode signal SD1, multiple sleep mode signals DSLP1, DSLPV1, and DSLPNDIO1, and an internal power down signal PD1_INT (see FIGS. 3-7 and 14-16).

The level shifter device 202 includes one or more level shifter circuits that output one or more signals in the V2 domain. The V2 domain includes circuitry (not shown) that is powered by and operate using the V2 voltage. In one embodiment, the level shifter device 202 is included in a processing device (e.g., processing device 126 shown in FIG. 1). The one or more signals output from the level shifter device 202 include the shutdown mode signal SD2 and the sleep mode signals DSLP2, DSLPV2, and DSLPNDIO2 (see FIGS. 3-7 and FIGS. 10-14). In one embodiment, the V1 domain is a VDD domain and the V2 domain is a VDDM domain.

The one or more signals output from the level shifter device 202 are received by the power management circuitry 124. As described earlier, the power management circuitry 124 includes power management circuits that are operably connected to various blocks in the memory macro. In the illustrated embodiment, the power management circuitry 124 is operably connected between the header circuits 122 and the level shifter device 202. The header circuits 122 includes header circuits that are operably connected to one or more blocks in the memory macro (e.g., memory macro 800 shown in FIG. 8). The header circuits 122 shown in FIG. 9 include one or more WLDV edge header circuits (represented by WLDV edge header circuit 906) that operably connect to one or more WLDV edge blocks in the memory macro (e.g., WLDV edge block 814 in FIG. 8) and one or more WLDV header circuits (represented by WLDV header circuit 908) that operably connect to one or more WLDV blocks in the memory macro (e.g., WLDV block 812 in FIG. 8). One or more memory array (MA) header circuits (represented by MA header circuit 910) operably connect to one or more MA blocks in the memory macro (e.g., MA blocks 802, 808 in FIG. 8). One or more IO edge header circuits (represented by IO edge header circuit 912) operably connect to one or more IO edge blocks in the memory macro (e.g., IO edge blocks 820, 824 in FIG. 8). The example header circuits 122 further include one or more IO header circuits (represented by IO header circuit 914) that operably connect to one or more IO blocks in the memory macro (e.g., IO blocks 822, 826 in FIG. 8), and one or more CNT header circuits (represented by CNT header circuit 916) that operably connect to one or more CNT blocks in the memory macro (e.g., CNT block 816 in FIG. 8).

The power management circuits in the power management circuitry 124 output signals that turn on and turn off select header circuits 122. The operations of turning on and turning off the header circuits 122 cause the V1 and the V2 signals in the memory macro to ramp up and ramp down according to one or more power ramping modes. Example power management circuits are described in conjunction with FIGS. 10-13.

Figure 10:
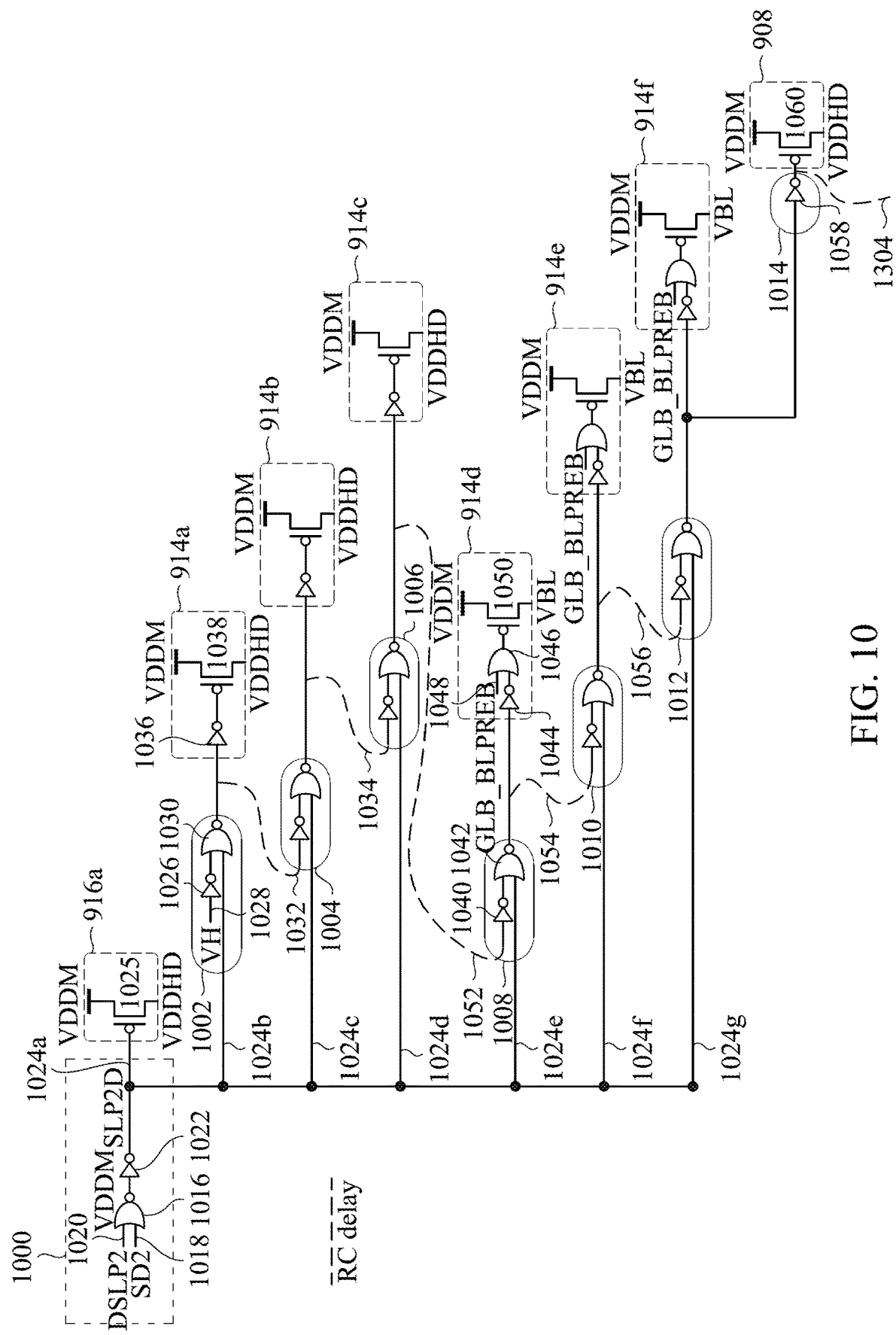
FIG. 10 illustrates a schematic diagram of a first example of power management circuits that are suitable for use in the power management circuitry in accordance with some embodiments.

FIG. 10 illustrates a schematic diagram of example first power management circuits that are suitable for use in the power management circuitry in accordance with some embodiments. As shown, the power management circuits 1000, 1002, 1004, 1006, 1008, 1010, 1012, 1014 are operably connected to header circuits 916a, 914a, 914b, 914c, 914d, 914e, 914f, 908, respectively. The header circuits 916a, 914a, 914b, 914c, 914d, 914e, 914f, 908 are operably connected between V1 (e.g., VDDHD, VBL, VDDAI) and V2 (e.g., VDDM). Some or all of the power management circuits 1000, 1002, 1004, 1006, 1008, 1010, 1012, 1014 can be implemented in the power management circuitry in the memory macro (e.g., power management circuitry 124 in FIGS. 1 and 9) and some or all of the header circuits 916a, 914a, 914b, 914c, 914d, 914e, 914f, 908 may be included in the header circuits (e.g., header circuits 122 in FIG. 1). The power management circuits 1000, 1002, 1004, 1006, 1008, 1010, 1012, 1014 operate in the V2 domain in one embodiment.

The example power management circuit 1000 operably connects to a header circuit 916a. In one embodiment, the header circuit 916a operably connects to one or more CNT blocks in a memory macro (e.g., CNT block 816 in FIG. 8). The power management circuit 1000 includes a NOR gate 1016 that receives the SD2 signal from a level shifter circuit (e.g., level shifter circuit shown in FIG. 4) on signal line 1018 and the DSLP2 signal from a level shifter circuit (e.g., level shifter circuit shown in FIG. 7) on signal line 1020. An output of the NOR gate 1016 is operably connected to an input of an inverter 1022. The output of the inverter 1022 (SLP2D signal on signal line 1024a) is operably connected to an input of the header circuit 916a. In the illustrated embodiment, the header circuit 916a is a p-type transistor 1025, although other embodiments are not limited to this configuration.

The header circuit 916a turns on to provide power (e.g., V2 signal), and turns off to provide power (e.g., V1 signal) to circuitry in the CNT block(s) of the memory macro (e.g., CNT block 816 in FIG. 8). Based on the states of the SD2 and the DSLP2 signals received from level shifter circuits on signal lines 1018, 1020, respectively, the power management circuit 1000 controls the power ramping mode(s) for circuitry in the CNT block(s). For example, the header circuit 916a turns on (e.g., signal level of SLP2D signal is low) when the signal levels of the SD2 and DSLP2 signals are low and turns off when at least one signal level of the SD2 and DSLP2 signals is high.

The example power management circuits 1002, 1004, 1006 are operably connected to header circuits 914a, 914b, 914c, respectively. In one embodiment, the header circuits 914a, 914b, 914c operably connect to one or more IO blocks in a memory macro (e.g., IO blocks 822, 826 in FIG. 8). Each example power management circuit 1002, 1004, 1006 includes an inverter 1026 that receives a signal VHI on signal line 1028. In one embodiment, the VHI signal is received from the V2 power source. An output of the inverter 1026 is operably connected to an input of a NOR gate 1030. Another input of the NOR gate 1030 (NOR gate 1030 in power management circuit 1002) receives the SLP2D signal on signal line 1024b. The NOR gate 1030 in the power management circuit 1004 receives the SLP2D signal on signal line 1024c and the NOR gate 1030 in the power management circuit 1006 receives the SLP2d signal on signal line 1024d. The SLP2D signal is output from the inverter 1022 in the power management circuit 1000.

The outputs of the NOR gate 1030 in each power management circuit 1002, 1004, 1006 are operably connected to an input of a respective header circuit 914a, 914b, 914c. Additionally, the output of the NOR gate 1030 in the power management circuit 1002 is input into the inverter 1026 in the power management circuit 1004 (dashed line 1032 represents RC delay). The output of the NOR gate 1030 in the power management circuit 1004 is input into the inverter 1026 in the power management circuit 1006 (dashed line 1034 represents RC delay).

Each example header circuit 914a, 914b, 914c includes an inverter 1036 that receives the signal output from the NOR gate 1030. The output of the inverter 1036 is operably connected to a transistor 1038 (e.g., the gate of the transistor 1038). In the illustrated embodiment, the transistor 1038 is a p-type transistor. The header circuits 914a, 914b, 914c turn on to provide power (e.g., V2 signal), and turn off to not provide power to circuitry in the IO block(s) of the memory macro (e.g., IO blocks 822, 826 in FIG. 8). Based on the states of the SD2 and the DSLP2 signals received from level shifter circuits on signal lines 1018, 1020, respectively, the power management circuits 1002, 1004, 1006 control the power ramping mode(s) for circuitry in the IO block(s). For example, the header circuits 914a, 914b, 914c turn on when the signal levels of the SD2 and DSLP2 signals are low and the signal level of the VHI signal is high. The header circuits 914a, 914b, 914c turn off when at least one signal level of the SD2 and DSLP2 signals is high or when the signal level of the VHI signal is low.

The example power management circuits 1008, 1010, 1012 are operably connected to header circuits 914d, 914e, 914f, respectively. In one embodiment, the header circuits 914d, 914e, 914f operably connect to one or more IO blocks in a memory macro (e.g., bit line precharge circuitry in IO blocks 822, 826 in FIG. 8). Each example power management circuit 1008, 1010, 1012 includes an output of an inverter 1040 operably connected to an input of a NOR gate 1042. Another input of the NOR gate 1042 (NOR gate 1042 in power management circuit 1008) receives the SLP2D on signal line 1024e. The NOR gate 1042 in the power management circuit 1010 receives the SLP2D signal on signal line 1024f and the NOR gate 1042 in the power management circuit 1012 receives the SLP2D signal on signal line 1024g.

The outputs of the NOR gates 1042 in the power management circuits 1008, 1010, 1012 are operably connected to an input of a respective header circuit 914d, 914e, 914f. Each example header circuit 914d, 914e, 914f includes an inverter 1044 that receives the signal output from the NOR gate 1042. An output of the inverter 1044 is operably connected to an input of an OR gate 1046. A GLB_BLPREB signal is input into another input of the OR gate 1046 on signal line 1048. In a non-limiting example, the GLB_BLPREB signal is the signal output from the NOR gate 1042. The output of the OR gate 1046 is operably connected to a transistor 1050 (e.g., a gate of the transistor 1050). In the illustrated embodiment, the transistor 1050 is a p-type transistor.

The signal output from the NOR gate 1030 in the power management circuit 1006 is input into the inverter 1040 in the power management circuit 1008 (dashed line 1052 represents RC delay). The output of the NOR gate 1042 in the power management circuit 1008 is input into the inverter 1040 in the power management circuit 1010 (dashed line 1054 represents RC delay). The output of the NOR gate 1042 in the power management circuit 1010 is input into the inverter 1040 in the power management circuit 1012 (dashed line 1056 represents RC delay).

The header circuits 914d, 914e, 914f turn on to provide power (e.g., V2 signal), and turn off to not provide power to circuitry in the IO block(s) of the memory macro (e.g., bit line pre-charge circuit(s) in IO blocks 822, 826 in FIG. 8). Based on the states of the SD2 and the DSLP2 signals received from level shifter circuits on signal lines 1018, 1020, respectively, and the states of the signals output from the NOR gates 1030, 1042, the power management circuits 1008, 1010, 1012 control the power ramping mode(s) for circuitry in the IO block(s). For example, the header circuits 914d, 914e, 914f turn on when the signal levels of the SD2 and DSLP2 signals are low, the signal level of the signal output from the NOR gate 1030 in the power management circuit 1006 is high, and the signal level of the GLB_BLPREB signal is low. The header circuits 914d, 914e, 914f turn off when at least one signal level of the SD2 and DSLP2 signals is high, when the signal level of the signal output from the NOR gate 1030 is low, or when the signal level of the GLB_BLPREB signal is high.

The example power management circuit 1014 is operably connected to a header circuit 908. In one embodiment, the header circuit 908 operably connects to one or more WLDV blocks in a memory macro (e.g., WLDV block 812 in FIG. 8). The example power management circuit 1014 includes an inverter 1058. The output of the NOR gate 1042 in the power management circuit 1012 is received by an input of the inverter 1058. The output of the inverter 1058 is operably connected to the WLDV header circuit 908. In the illustrated embodiment, the header circuit 908 is a p-type transistor 1060.

The header circuit 908 turns on to provide power (e.g., V2 signal), and turns off to provide power (e.g., V1 signal) to the circuitry in the WLDV block(s) of a memory macro (e.g., WLDV block 812 in FIG. 8). Based on the states of the SD2 and the DSLP2 signals received from level shifter circuits on signal lines 1018, 1020, respectively, and on the signal level of the GLB_BLPREB signal output from the NOR gate 1042 in the power management circuit 1012, the power management circuit 1014 controls the power ramping mode(s) for circuitry in the WLDV block(s). For example, the header circuit 908 turns on when the signal levels of the SD2 and DSLP2 signals are low and the signal level of the GLB_BLPREB signal output from the NOR gate 1042 in the power management circuit 1012 is high. The header circuit 908 turns off when at least one signal level of the SD2 and DSLP2 signals is high or when the signal level of the GLB_BLPREB signal is low.

Figure 11:
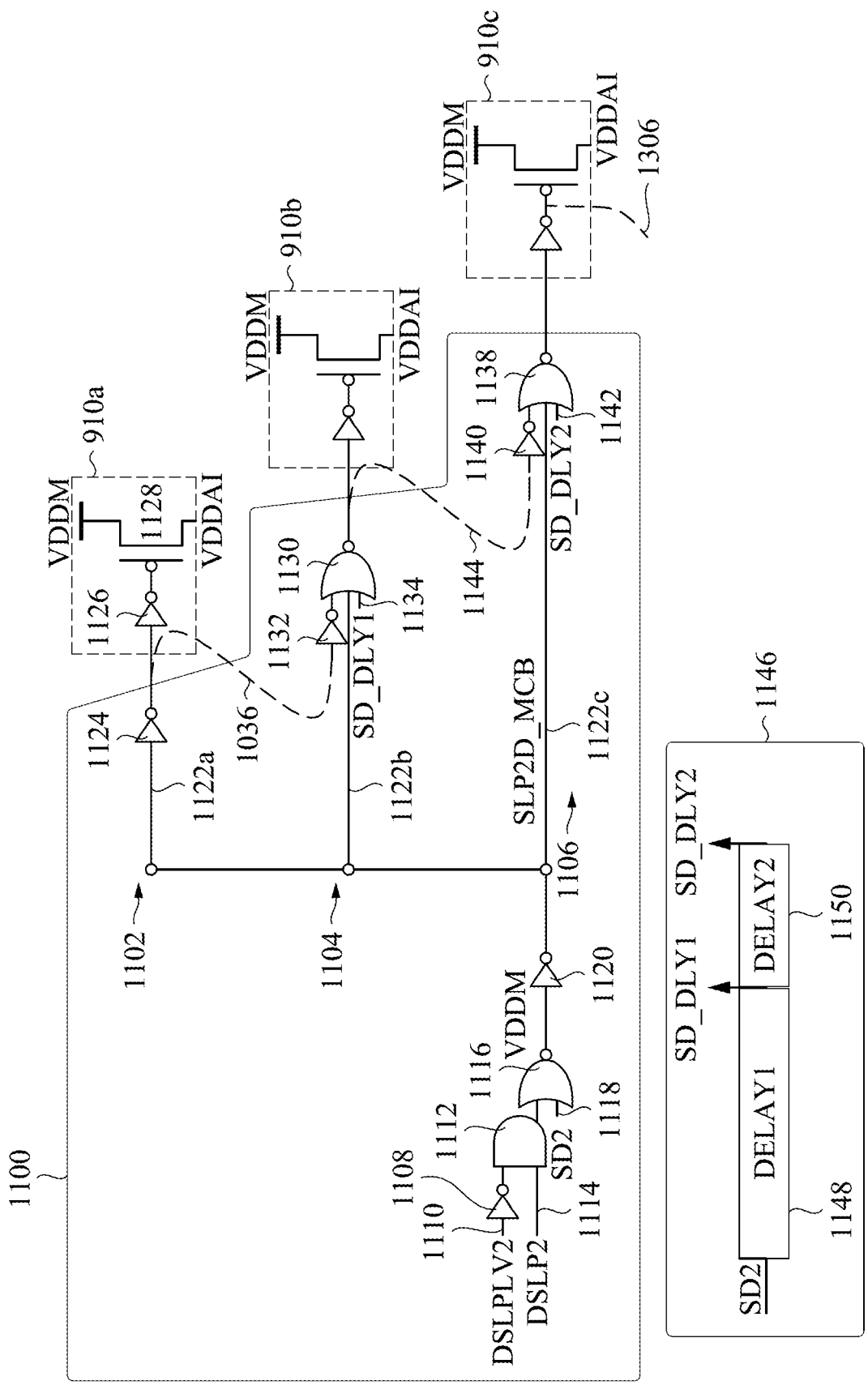
FIG. 11 illustrates a schematic diagram of a second example of a power management circuit that is suitable for use in the power management circuitry in accordance with some embodiments.

FIG. 11 illustrates a schematic diagram of a second example of power management circuits that are suitable for use in the power management circuitry in accordance with some embodiments. The power management circuit block 1100 includes power management circuits 1102, 1104, 1106 that are operably connected to header circuits 910a, 910b, 910c, respectively. In one embodiment, the header circuits 910a, 910b, 910c are operably connected to one or more MA blocks in a memory macro (e.g., MA blocks 802, 808 in FIG. 8). The header circuits 910a, 910b, 910c are operably connected between V1 (e.g., VDDAI) and V2 (e.g., VDDM). Some or all of the power management circuits 1102, 1104, 1106 can be implemented in the power management circuitry in the memory macro (e.g., power management circuitry 124 in FIGS. 1 and 9) and some or all of the header circuits 910a, 910b, 910c may be included in the header circuits (e.g., header circuits 122 in FIG. 1). In the illustrated embodiment, the power management circuits 1102, 1104, 1106 operate in the V2 domain.

The example power management circuit block 1100 includes an inverter 1108 that receives the DSLPLV2 signal from a level shifter circuit (e.g., level shifter circuit shown in FIG. 7) on signal line 1110. An output of the inverter 1108 is input into an AND gate 1112. The DSLP2 signal from a level shifter circuit (e.g., level shifter circuit shown in FIG. 7) is received by another input of the AND gate 1112 on signal line 1114. The output of the AND gate 1112 is received by an input of a NOR gate 1116. The SD2 signal from a level shifter circuit (e.g., level shifter circuit shown in FIG. 4) is received by another input of the NOR gate 1116 on signal line 1118.

The output of the NOR gate 1116 is input into an inverter 1120. The inverter 1108, the AND gate 1112, the NOR gate 1116, and the inverter 1120 are included in the power management circuits 1102, 1104, 1106. The output of the inverter 1120 (the SLP2D_MCB) is input into the power management circuits 1102, 1104, 1106 on signal lines 1122a, 1122b, 1122c, respectively. The example power management circuit 1102 includes an inverter 1124 that receives the SLP2D_MCB signal on signal line 1122a. The output of the inverter 1124 is input into the header circuit 910a. The example header circuits 910a, 910b, 910c each include an inverter 1126. The output of the inverter 1126 is input into a transistor 1128. In the illustrated embodiment, the transistor 1128 is a p-type transistor.

The power management circuit 1104 includes a NOR gate 1130 that receives the SLP2D_MCB signal on signal line 1122b. Another input of the NOR gate 1130 receives an output of an inverter 1132. Another input of the NOR gate 1130 receives a signal SD_DLY1 on signal line 1134. The output of the inverter 1124 in the power management circuit 1102 is received as an input by the inverter 1132 (dashed line 1136 represents RC delay). The output of the NOR gate 1130 is input into the header circuit 910b (e.g., input into the inverter 1126 of the header circuit 910b).

The power management circuit 1106 includes a NOR gate 1138 that receives the SLP2D_MCB signal on signal line 1122c. Another input of the NOR gate 1138 receives an output of an inverter 1140. Another input of the NOR gate 1138 receives a signal SD_DLY2 on signal line 1142. The output of the NOR gate 1130 in the power management circuit 1104 is received as an input by the inverter 1140 (dashed line 1144 represents RC delay). The output of the NOR gate 1138 is input into the header circuit 910c (e.g., input into the inverter 1126 of the header circuit 910c).

The SD_DLY1 and SD_DLY2 signals are delayed signals of the SD2 signal, as shown in area 1146. The SD2 signal is input into a delay circuit to produce a first delay 1148. The first delay produces the SD_DLY1 signal. The SD_DLY1 signal is input into another delay circuit to produce a second delay 1150. The second delay 1150 produces the SD_DLY2 signal. A non-limiting example of the delay circuits is a buffer circuit. The SD_DLY1 and the SD_DLY2 signals are used to manage and separate the peak current levels in one or more MA header circuits (e.g., header circuits 910a, 910b, 910c) that are operably connected to one or more MA blocks (e.g., MA blocks 802, 808 in FIG. 8).

The header circuits 910a, 910b, 910c turn on to provide power (e.g., V2 signal), and turn off to not provide power to circuitry in respective MA block(s) of a memory macro (e.g., MA blocks 802, 808 in FIG. 8). Based on the states of the SD2, the DSLP2, and the DSLPV2 signals, the power management circuits 1102, 1104, 1106 control the power ramping mode(s) for circuitry in the MA block(s). For example, the header circuit 910a turns on when the signal level of the SLP2D_MCB signal is low. The signal level of the SLP2D_MCB signal is low when the signal level of the SD2 signal is low, and the signal level of the DSLPLV2 signal is high (regardless of the signal level of the DSLP2 signal) or the signal level of the DSLP2 signal is low (regardless of the signal level of the DSLPLV2 signal).

The example header circuit 910b turns on when the signal levels of the SLP2D_MCB signal and the SD_DLY1 signal are low. The example header circuit 910c turns on when the signal levels of the SLP2D_MCB signal and the SD_DLY2 signal are low.

Figure 12:
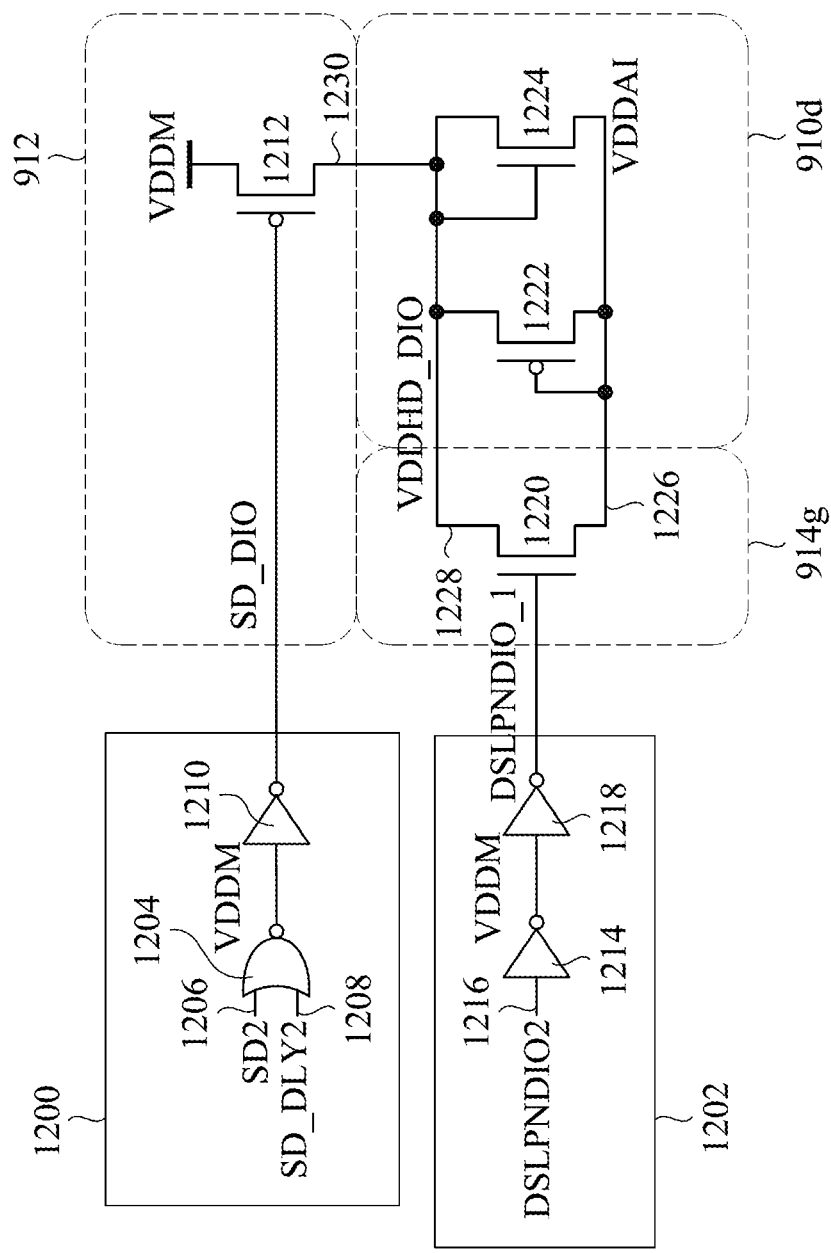
FIG. 12 illustrates a schematic diagram of a third example of power management circuits that are suitable for use in the power management circuitry in accordance with some embodiments.

FIG. 12 illustrates a schematic diagram of a third example of power management circuits that are suitable for use in the power management circuitry in accordance with some embodiments. The example power management circuit 1200 is operably connected to header circuit 912. In one embodiment, the header circuit 912 is operably connected to one or more IO edge blocks in a memory macro (e.g., IO edge blocks 820, 824 in FIG. 8). The example power management circuit 1202 is operably connected to header circuit 914g and to the header circuit 910d. The header circuit 914g can be operably connected to one or more IO blocks and the header circuit 910d to one or more MA blocks in a memory macro (e.g., IO blocks 822, 826 and MA blocks 802, 808 in FIG. 8). In another embodiment, the header circuit 910d may be replaced with a header circuit that is operably connected to the one or more IO blocks. The header circuits 914g, 910d are operably connected between V1 (e.g., VDDAI) and V2 (e.g., VDDM). Some or all of the power management circuits 1200, 1202 can be implemented in the power management circuitry in the memory macro (e.g., power management circuitry 124 in FIGS. 1 and 9) and some or all of the header circuits 912, 910d, 914g may be included in the header circuits (e.g., header circuits 122 in FIG. 1). The power management circuits 1200, 1202 operate in the V2 domain in one embodiment.

The power management circuit 1200 includes a NOR gate 1204 that receives the SD2 signal on signal line 1206 and receives the SD_DLY2 signal (area 1146 in FIG. 11) on signal line 1208. The output of the NOR gate 1204 is input into an inverter 1210. The output of the inverter 1210 (the SD_DIO signal) is input into the header circuit 912. The example header circuit 912 is implemented as a p-type transistor 1212, although other embodiments are not limited to this configuration. The example header circuit 912 turns on when the signal level of the SD_DIO signal is low (e.g., when the signal levels of the SD2 signal and the SD_DLY2 signal are low).

The power management circuit 1202 includes an inverter 1214 that receives the DSLPNDIO2 signal on signal line 1216. The output of the inverter 1214 is input into an inverter 1218. The output of the inverter 1218 (the DSLPN-DIO_1 signal) is input into the header circuit 914*g*. In the illustrated embodiment, the header circuit 914*g* is an n-type transistor 1220 and the output of the inverter 1218 is received by the gate of the n-type transistor 1220.

The example header circuit 910*d* includes a p-type transistor 1222 connected in parallel with an n-type transistor 1224. The p-type transistor 1222 is also connected in parallel with the header circuit 914*g* (e.g., the n-type transistor 1220). The gate of the p-type transistor 1222 is operably connected to a first terminal 1226 of the header circuit 914*g*. The gate of the n-type transistor 1224 is operably connected to a second terminal 1228 of the header circuit 914*g*. Additionally, a terminal 1230 of the header circuit 912 is operably connected to the second terminal 1228 of the header circuit 914*g*. The example header circuits 914*g*, 910*d* turn on when the signal level of the DSLPNDIO_1 signal is high (e.g., when the signal level of the DSLPNDIO2 signal is high).

Figure 13:
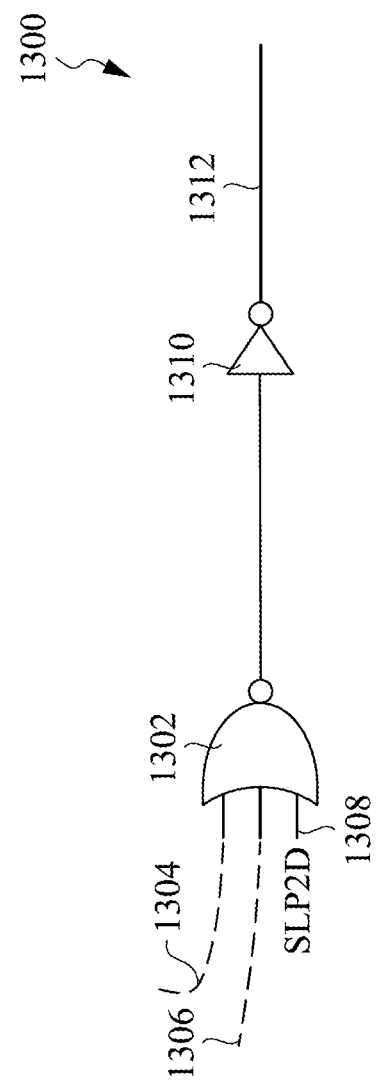
FIG. 13 illustrates a schematic diagram of a fourth example of a power management circuit that is suitable for use in the power management circuitry in accordance with some embodiments.
Figure 14:
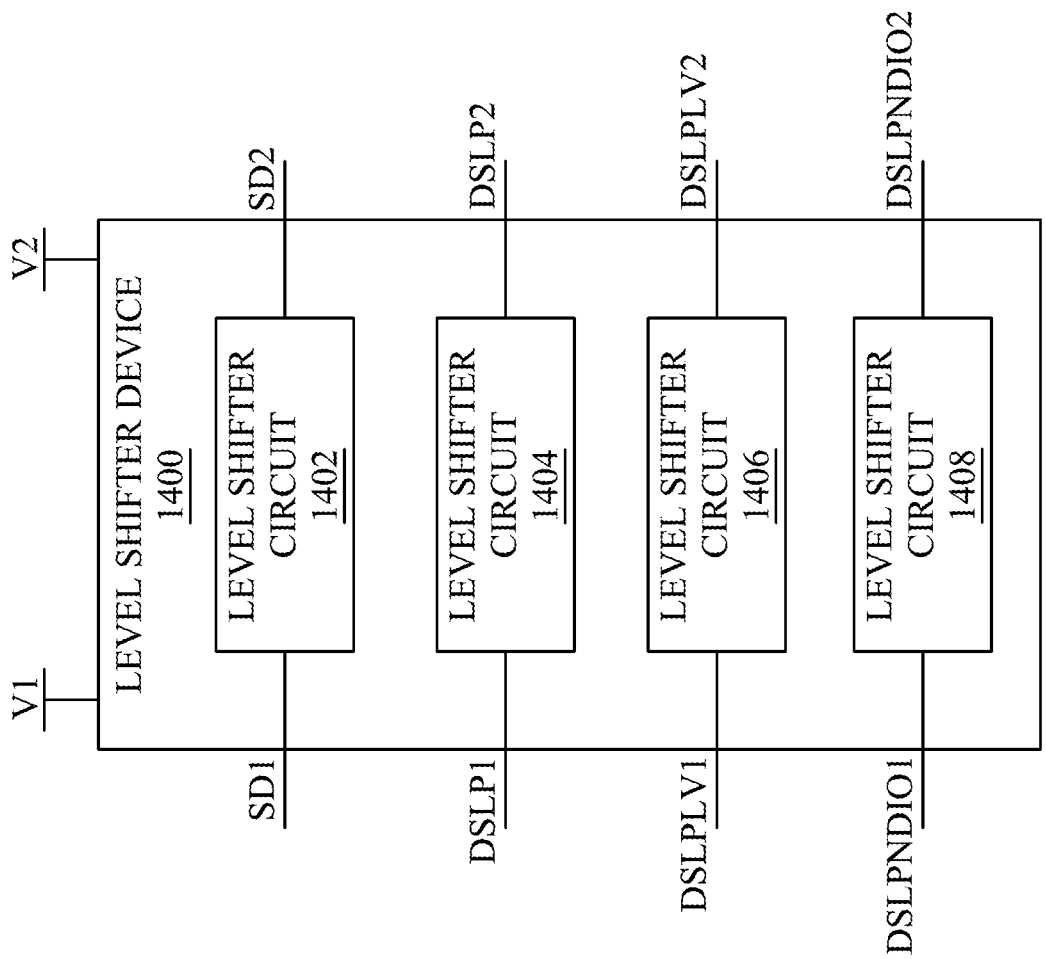
FIG. 14 illustrates an example level shifter device that is suitable for use with the power management circuits shown in FIGS. 10-13 in accordance with some embodiments.

FIG. 13 illustrates a schematic diagram of a fourth example of a power management circuit that is suitable for use in the power management circuitry in accordance with some embodiments. In one embodiment, the power management circuit 1300 is wakeup circuit that connects to a main control circuit, and the output of the power management circuit 1300 is used as an isolate control signal to prevent potential leakage during shutdown. The power management circuit 1300 can be implemented in the power management circuitry in the memory macro (e.g., power management circuitry 124 in FIGS. 1 and 9). The power management circuit 1300 operates in the V2 domain in one embodiment.

The power management circuit 1300 includes a NOR gate 1302 that receives the signal output from the inverter 1058 shown in FIG. 10 as an input signal (dashed line 1304 represents RC delay). The NOR gate 1302 receives the signal output from the inverter 1126 in the header circuit 910*c* shown in FIG. 11 as an input signal (dashed line 1306 represents RC delay). The NOR gate 1302 receives the SLP2D signal output by the inverter 1022 in the power management circuit 1000 (FIG. 10) as an input signal on signal line 1308. The output of the NOR gate 1302 is operably connected to an input of an inverter 1310. The inverter 1310 outputs a wakeup signal on signal line 1312.

FIG. 14 illustrates an example level shifter device that is suitable for use with the power management circuits shown in FIGS. 10-13 in accordance with some embodiments. The level shifter device 1400 includes four level shifter circuits 1402, 1404, 1406, 1408. In one embodiment, the level shifter device 1400 is the level shifter device 128 shown in FIG. 1. Each level shifter circuit 1402, 1404, 1406, 1408 receives a signal from the V1 domain (e.g., V1 domain 902 in FIG. 9) and outputs a signal in the V2 domain.

The level shifter circuit 1402 receives the SD1 signal from the V1 domain and outputs the SD2 signal in the V2 domain. The SD2 signal is used as an input signal in the power management circuits 1000 (FIG. 10), 1100 (FIG. 11), and 1200 (FIG. 12). In one embodiment, the level shifter circuit 1402 is implemented as the level shifter circuit 300*a* shown in FIG. 4.

The level shifter circuit 1404 receives the DSLP1 signal from the V1 domain and outputs the DSLP2 signal in the V2 domain. The DSLP2 signal is used as an input signal in the power management circuits 1000 (FIG. 10) and 1100 (FIG. 11). In one embodiment, the level shifter circuit 1406 is implemented as the level shifter circuit 600 shown in FIG. 7.

The level shifter circuit 1406 receives the DSLPLV1 signal from the V1 domain and outputs the DSLPLV2 signal in the V2 domain. The DSLPLV2 signal is used as an input signal in the power management circuit 1100 (FIG. 11). In one embodiment, the level shifter circuit 1406 is implemented as the level shifter circuit 600 shown in FIG. 7.

The level shifter circuit 1408 receives the DSLPNDIO1 signal from the V1 domain and outputs the DSLPNDIO2 signal in the V2 domain. The DSLPNDIO2 signal is used as an input signal in the power management circuit 1200 (FIG. 12). In one embodiment, the level shifter circuit 1408 is implemented as the level shifter circuit 600 shown in FIG. 7.

In the embodiments that include a level shifter circuit that outputs the SD2 signal (FIGS. 3-5), the power management circuits shown in FIG. 10 do not include the NOR gate 1016 and the inverter 1022, and the SD2 signal is received on signal line 1024*a*-1024*g*. The power management circuits shown in FIG. 11 do not include the inverter 1108, the AND gate 1112, the NOR gate 1116, and the inverter 1120. The SD2 signal is received on the signal line 1122*a*, 1122*b*, 1122*c*. The power management circuit 1202 in FIG. 12 may be omitted.

In the embodiments that include a level shifter circuit that outputs the SD2 signal and a level shifter circuit that outputs the DSLP2 signal (FIGS. 6-7), the power management circuits shown in FIG. 11 do not include the inverter 1108 and the AND gate 1112. The SD2 and the DSLP2 signals are received by the NOR gate 1116. The inverter 1214 in the power management circuit 1202 in FIG. 12 receives the DSLP2 signal.

Figure 15:
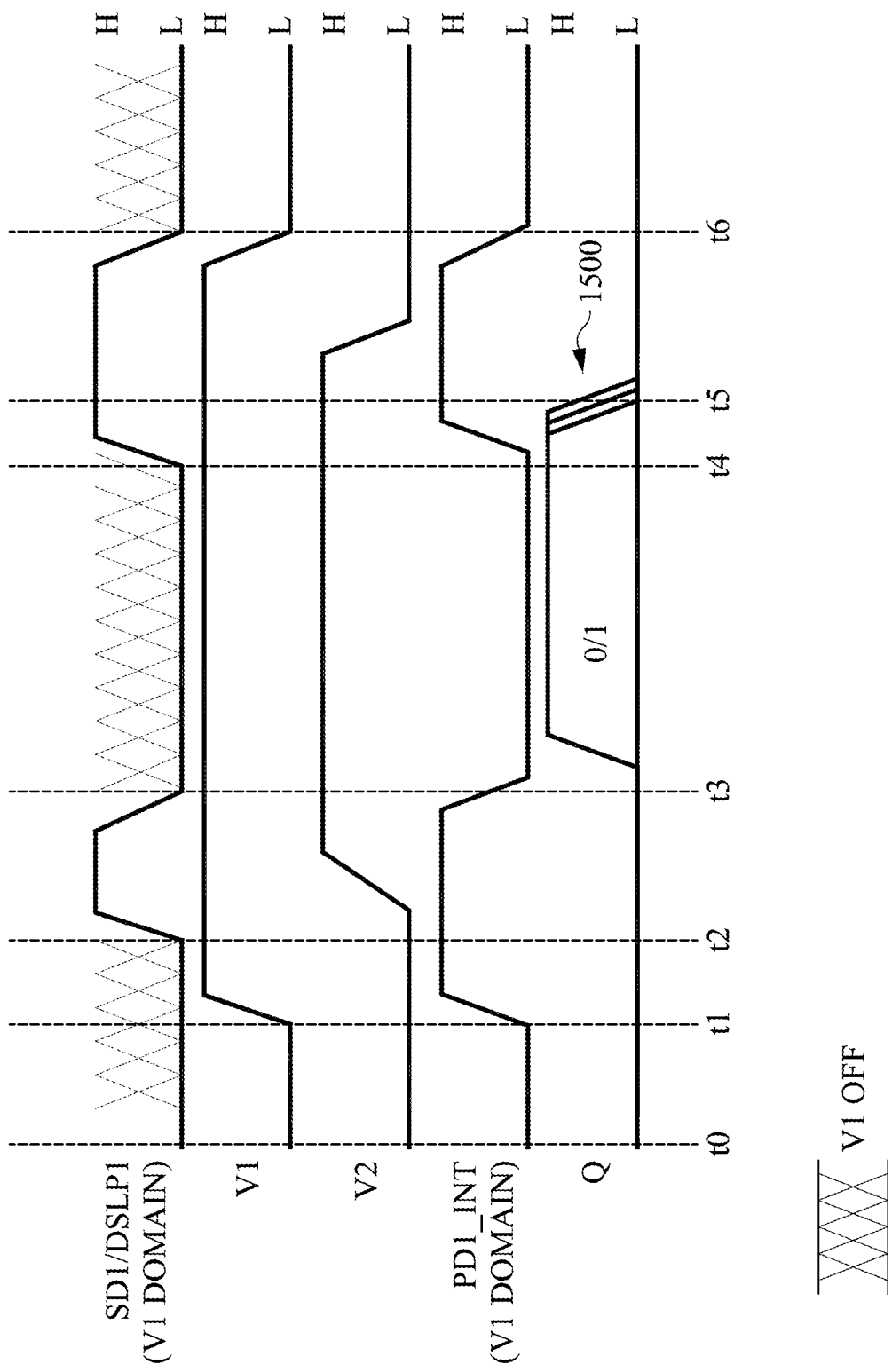
FIG. 15 illustrates an example timing diagram for a first power ramping mode in accordance with some embodiments.

FIG. 15 illustrates an example timing diagram for a first power ramping mode in accordance with some embodiments. The illustrated embodiment depicts the DL mode where the V1 voltage signal ramps up before the V2 voltage signal ramps up and the V1 voltage signal ramps down after the V2 voltage signal ramps down.

At time t0, the SD1 signal, the DSLP1 signal (if used), the V1 signal, the V2 signal, and the PD1_INT signal are at a low signal level (e.g., logic state 0). The PD1_INT signal is an internal power down control signal in the V1 domain that can be used to power down the V1 domain for a shutdown mode, a sleep mode, a bulk off mode (bulk off mode shown in FIG. 16), and/or during the time periods in which the V2 signal ramps up and ramps down. The signal Q that is output from the memory macro is also at a low signal level. As discussed previously, in one embodiment, the V1 voltage signal is a VDD voltage signal and the V2 signal is a VDDM voltage signal.

At time t1, the V1 signal and the PD1_INT signal begin to ramp up to a high signal level (e.g., logic state 1). As discussed earlier, the V1 signal ramps up before the V2 signal in the DL mode. In one embodiment, the logic circuit 904 provides the SD1 signal to a buffer circuit to output the PD1_INT signal, where the PD1_INT signal ramps up. The level shifter device 128 and the power management circuitry 124 (e.g., power management circuits shown in FIG. 10)

cause the V1 signal to ramp up. The SD1/DSLP1 signal, the V2 signal, and the Q signal remain at a low signal level.

At time t2, the SD1 signal (and if used the DSLP1 signal) begin to ramp up to a high signal level. For example, the logic circuit 904 (FIG. 9) causes the SD1 and the DSLP1 signal to ramp up. The SD1 signal is received by the level shifter circuit 300a, 300b (FIGS. 4 and 5) and the DSLP1 signal is received by the level shifter circuit 600 (FIG. 6). The V1 signal and the PD1_INT signal are at a high signal level. The V2 signal and the Q signal remain at a low signal level.

Between time t2 and time t3, the V2 signal ramps up to a high signal level and the SD1/DSLP1 signal(s) ramps down to a low signal level. In one embodiment, the level shifter device 128 (FIG. 1) and the power management circuitry 124 (e.g., power management circuits shown in FIG. 10) cause the V2 signal to ramp up based on data received from the logic circuitry 130, and the logic circuit 904 causes the SD1 signal to ramp down. Also, once the V2 signal is at the high signal level, the PD1_INT signal begins to ramp down to a low signal level. In one embodiment, the SD1 signal and the DSLP1 signal ramp up to a high signal level and ramp down to a low signal level between times t2 and t3 to reduce or to avoid leakage on the power rail for V1.

At time t3, the SD1 signal (and if used the DSLP1 signal) is at a low signal level. The V1 signal and the V2 signal are at a high signal level. The PD1_INT signal is ramping down to the low signal level or is at the low signal level. Between time t3 and time t4, a read operation or a write operation is performed, and the signal Q is output by the memory macro (represented in the illustrated embodiment as the Q signal ramping up to a high signal level). However, the value or signal level of the Q signal can be a low signal level (e.g., logic state 0) or a high signal level as shown (e.g., logic state 1), depending on the data stored in the memory cell that is accessed.

At time t4, the SD1 signal and the DSLP1 signal ramp up to a high signal level. For example, the logic circuit 904 causes the SD1 and the DSLP1 signal to ramp up. The V1 signal, the V2 signal, and the Q signal remain at a high signal level. Between times t4 and t5, the SD1/DSLP1 signal(s) ramps up to a high signal level to reduce or avoid leakage on the V1 power rail.

Between time t4 and time t6, the Q signal ramps down to a low signal level. When the V1 and the V2 signals at a high signal level, the signal level of the Q signal is uncertain in that the signal level can be high or low (0/1). In the illustrated embodiment, the uncertainty of the Q signal is represented by the three lines in area 1500.

Between times t5 and t6, the V2 signal ramps down to a low voltage signal. In one embodiment, the level shifter device 128 (FIG. 1) and the power management circuitry 124 (e.g., power management circuits shown in FIG. 10) cause the V2 signal to ramp up based on data received from the logic circuitry 130. After the V2 signal is at the low signal level, the SD1/DSLP1 signal(s), the V1 signal, and the PD1_INT signal ramp down to a low signal level. For example, the logic circuit 904 causes the SD1/DSLP1 signal(s) to ramp down and provides the SD1 signal to a buffer circuit. The PD1_INT signal is output from the buffer circuit. Thus, the PD1_INT signal ramps down. The level shifter device 128 (FIG. 1) and the power management circuitry 124 (e.g., power management circuits shown in FIG. 10) cause the V1 signal to ramp down. After time t6, the SD1/DSLP1 signal(s), the V1 signal, the V2 signal, the PD1_INT signal, and the Q signal are all at a low signal level.

Figure 16:
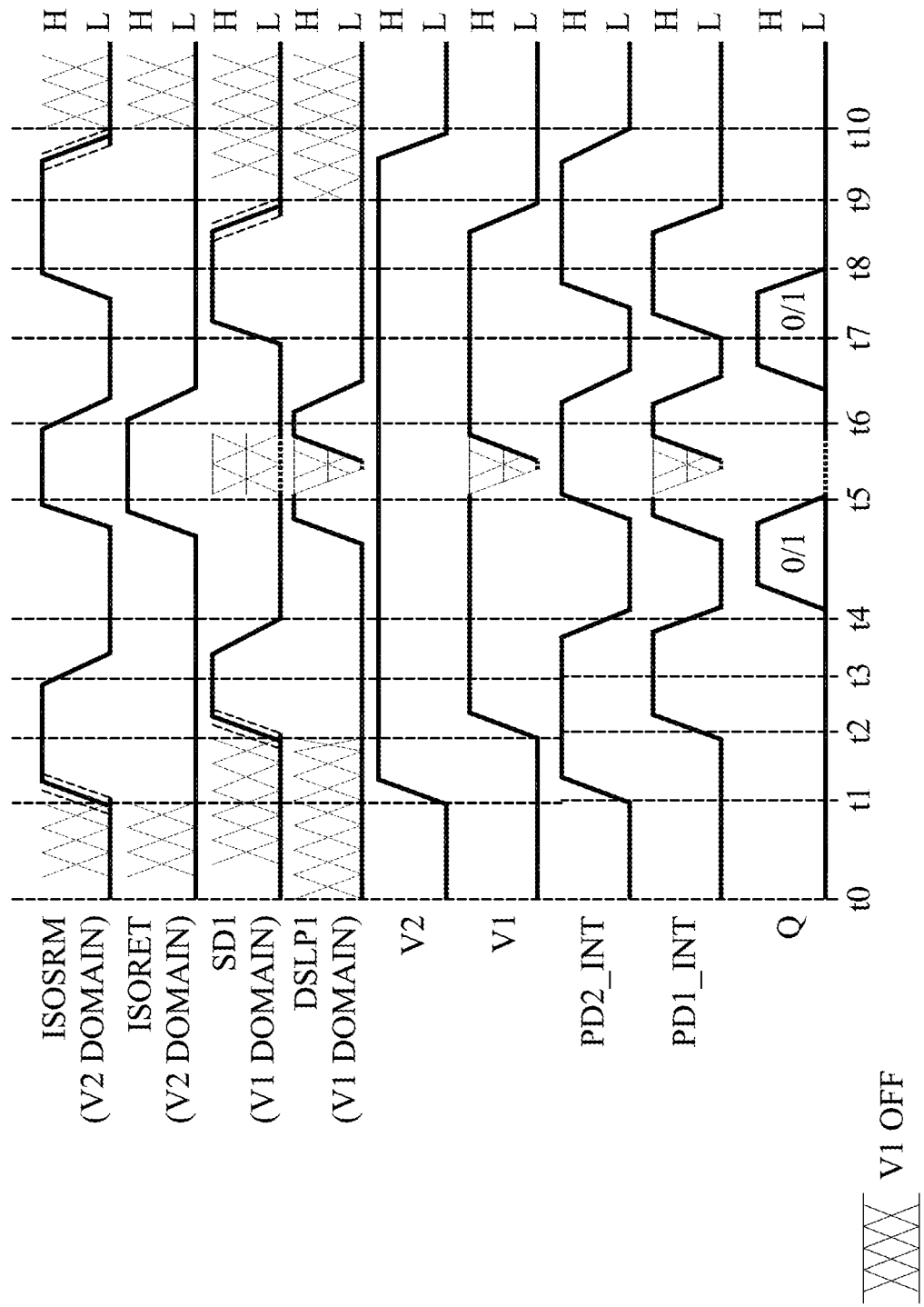
FIG. 16 illustrates an example timing diagram for a second power ramping mode in accordance with some embodiments.

FIG. 16 illustrates an example timing diagram for a second power ramping mode in accordance with some embodiments. The illustrated embodiment depicts the DM mode where the V2 voltage signal ramps up before the V1 voltage signal ramps up and the V2 voltage signal ramps down after the V1 voltage signal ramps down. The timing diagram also shows the execution of a bulk off mode. As described earlier, the bulk off mode is an additional power saving mode that turns off the V1 power source when the memory macro is in the sleep mode, At time t0, the ISOSRM signal, the ISORET signal, the SD1 signal, the DSLP1 signal, the V2 signal, the V1 signal, the PD1_INT signal, a PD2_INT signal, and the Q signal are at a low signal level (e.g., logic state 0). The PD2_INT signal is an internal power down signal in the V2 domain that is used to power down the V2 domain during the time periods the V1 and the V2 signals ramp up or ramp down.

At time t1, the ISOSRM signal, the V2 signal, and the PD2_INT signal begin to ramp up to a high signal level (e.g., logic state 1). In one embodiment, the processing device 126 (FIG. 1) causes the ISOSRM signal to ramp up, and the level shifter device 128 and the power management circuitry 124 (e.g., power management circuits shown in FIG. 10) cause the V2 signal to ramp up. Although not shown in FIGS. 4 and 5, the SD1 signal input is also used to output the PD2_INT signal from a level shifter device (e.g., level shifter device 128). The ISORET signal, the SD1 signal, the DSLP1 signal, the V1 signal, the PD1_INT signal, and the Q signal remain at a low signal level. In one embodiment, the SIOSRM signal must be at the high signal level during the entire V2 and V1 signal ramping up time period (time t1 to time t3) to reduce or prevent DC current at the level shifter circuit(s).

At time t2, the SD1 signal and the V1 signal begin to ramp up to a high signal level. As discussed earlier, the logic circuit 904 (FIG. 9) causes the SD1 signal to ramp up, and the level shifter device 128 and the power management circuitry 124 (e.g., power management circuits shown in FIG. 10) cause the V1 signal to ramp up. In one embodiment, the SD1 signal ramps up to a high signal level to reduce or avoid leakage on the power rail for V2. The ISOSRM signal, the V2 signal, and the PD2_INT signal remain at a high signal level. The ISORET signal, the DSLP1 signal, and the Q signal remain at a low signal level.

Between times t2 and t3, the V1 signal ramps up to the high signal level and the input(s) of the level shifter circuit(s) is in a floating state while V1 is ramping up. Thus, in one embodiment, the V1-to-V2 domain interfaces are isolated to prevent DC current in the level shifter circuit.

At time t3, the ISORET signal, the DSLP1 signal, and the Q signal remain at a low signal level. The SD1 signal, the PD1_INT signal, the V2 signal, the V1 signal, and the PD2_INT signal remain at a high signal level and the ISOSRM signal begins to ramp down to a low signal level. The processing device 126 (FIG. 1) causes the ISOSRM signal to ramp down based on data received from the logic circuitry 130.

Between time t3 and t4, the SD1 signal and the ISOSRM signal ramp down to a low signal level, and the PD1_INT and PD2_INT signals begin to ramp down to a low signal level. The logic circuit 904 (FIG. 9) causes the SD1 signal and the PD1_INT signal to ramp down, the processing device 126 (FIG. 1) causes the ISOSRM signal to ramp down, and the level shifter device 128 causes the PD2_INT signal to ramp down.

At time t4, the ISOSRM signal, the ISORET signal, the SD1 signal, the DSLP1 signal, and the Q signal are at a low signal level. The V1 and the V2 signals remain at a high signal level.

Between time t4 and time t5, the ISOSRM signal, the ISORET signal and the DSLP1 signal ramp up to a high signal level. In one embodiment, the processing device 126 (FIG. 1) cause the ISOSRM signal and the ISORET signal to ramp up, and the logic circuit 904 (FIG. 9) cause the DSLP1 signal to ramp down. A read or a write operation can be performed between times t4 and t5, which is represented by the Q signal ramping up and ramping down. Similar to FIG. 15, the value or signal level of the Q signal can be a low signal level (e.g., logic state 0) or a high signal level (e.g., logic state 1), depending on the data stored in the memory cell that is accessed.

At time t5, the ISOSRM signal, the ISORET signal, the DSLP1 signal, the V2 signal, and the V1 signal are at a high signal level. The SD1 signal remains at a low signal level. The ISORET signal causes the memory macro to be placed into a bulk off mode. A bulk off mode is depicted between times t5 and t6, where the V1 signal is turned off while the V2 signal is at a high signal level. Accordingly, between times t4 and t7, the PD1_INT signal ramps up and ramps down for the bulk off mode and the PD2_INT signal ramps up and ramps down due to the transitions in the V1 signal.

Between times t5 and t6, the ISORET signal ramps up to a high signal level and the DSLP1 signal ramps down to a low signal level when the V1 signal is turned off. Data is retained in one or more memory cells between times t5 and t6 when the ISORET and ISOSRM signals are at a high signal level. Additionally, the signal levels of the ISOSRM and the ISORET signals are high to cover the time period in which V2 is high and V1 is low to retain the data in the memory cell(s) when the signal level of the DSLP signal is high. In one embodiment, the processing device 126 (FIG. 1) causes the ISORET signal to ramp up and the logic circuit 904 (FIG. 9) causes the DSLP1 signal to ramp down.

Between times t6 and t7, the ISOSRM signal, the ISORET signal, the SD1 signal, and the DSLP1 signal are at a low signal level and the V1 and V2 signals are at a high signal level. During this time, a read or write operation can be performed, as represented by the Q signal transitioning to a high signal level. However, as noted earlier, the value or signal level of the Q signal can be a low signal level (e.g., logic state 0) or a high signal level (e.g., logic state 1), depending on the data stored in the memory cell that is accessed.

Between times t7 and t8, the SD1 signal ramps up to a high signal level, which causes the Q signal to ramp down to a low signal level. In one embodiment, the logic circuit 904 (FIG. 9) causes the SD1 signal to ramp up. The V1 and V2 signals are at a high signal level. The ISOSRM signal, the ISORET signal, and the DSLP signal are at a low signal level.

Between time t8 and time t9, the ISORET signal, the DSLP1 signal, and the Q signal are at a low signal level. The SD1 signal and the V1 signal ramp down to a low signal level. As discussed earlier, the V1 signal ramps down before the V2 signal ramps down in the DM mode. The high signal level of the ISOSRM signal remains at the high signal level between time t8 to time t10 to reduce or prevent DC current at the level shifter circuit(s).

Between times t9 and t10, the ISOSRM signal, the V2 signal, and the PD2_INT signal ramp down. The processing device 126 (FIG. 1) cause the ISOSRM signal to ramp down, the level shifter device 128 causes the PD2_INT signal to ramp down, and the level shifter device 128 and the power management circuitry 124 (e.g., power management circuits shown in FIG. 10) cause the V2 signal to ramp down. After time t10, the ISOSRM signal, the ISORET signal, the SD1 signal, the DSLP1 signal, the V2 signal, the V1 signal, the SD2 signal, and the Q signal are at a low signal level.

Figure 17:
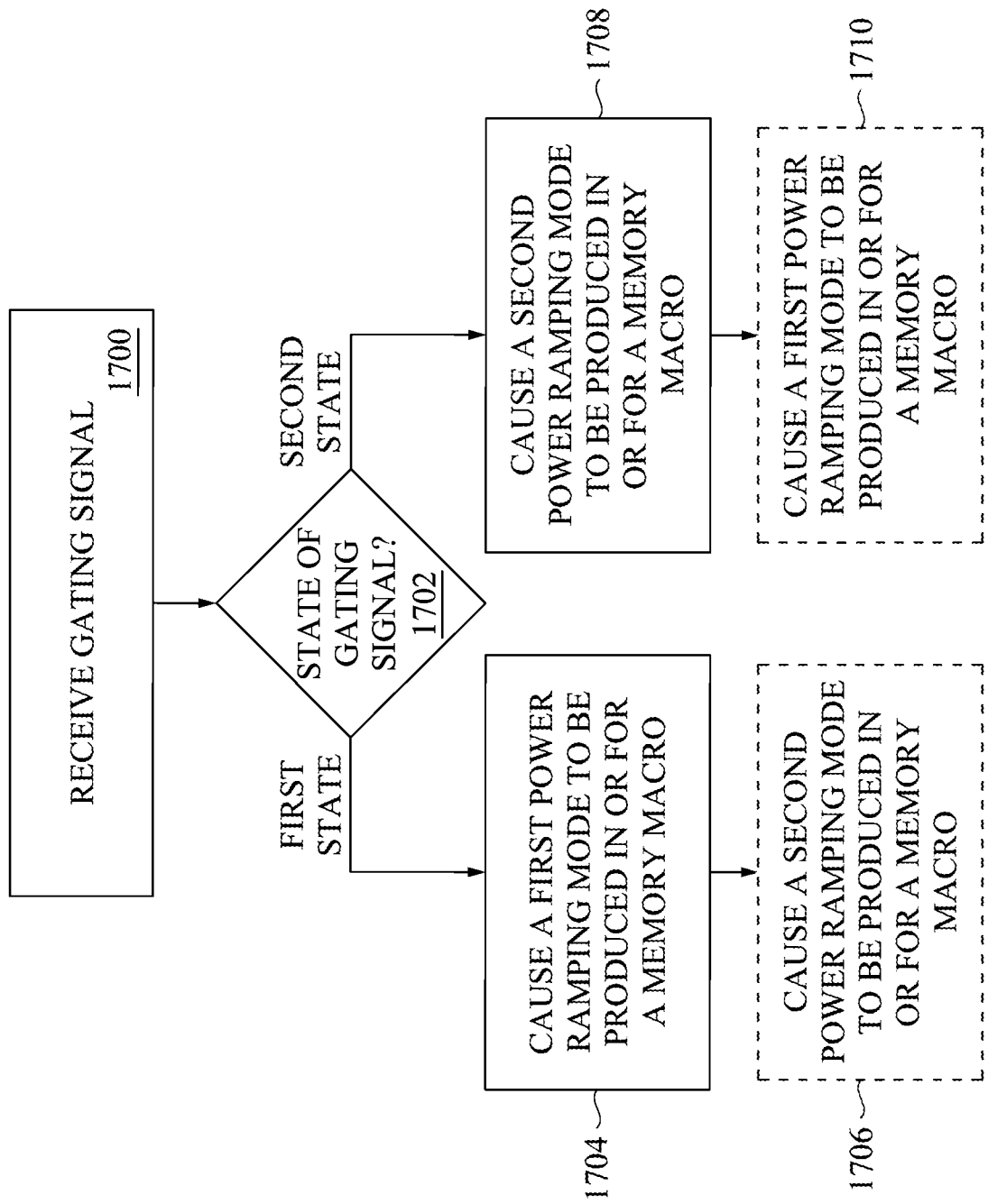
FIG. 17 illustrates an example flowchart of a method of operating a power ramping control system in accordance with some embodiments.

FIG. 17 depicts an example flowchart of a method of operating a power ramping control system in accordance with some embodiments. Initially, a gating signal is received by a level shifter device at block 1700. In one embodiment, the gating signal is the ISOSRM signal. A determination is made at block 1702 as to whether the state of the gating signal is in a first state (e.g., signal level is low) or in a second state (e.g., signal level is high). If the state of the gating signal is in the first state, the process passes to block 1704 where a first power ramping mode is caused to be produced in or for a memory macro. The method then optionally continues at block 1706 where a second power ramping mode is caused to be produced in or for the memory macro.

In one embodiment, the first power ramping mode (block 1704) is the DM mode, and the second power ramping mode (block 1706) is the DL mode. In the DM mode, the V2 signal ramps up before the V1 signal ramps up, and the V1 signal ramps down before the V2 signal ramps down. In the DL mode, the V1 signal ramps up before the V2 signal ramps up, and the V2 signal ramps down before the V1 signal ramps down. FIG. 16 shows an example timing diagram for the DM mode, and FIG. 15 depicts an example timing diagram for the DL mode. In another embodiment, the first power ramping mode (block 1704) is the DL mode, and the second power ramping mode (block 1706) is the DM mode.

If the state of the gating signal is in the second state, the process passes to block 1708 where a second power ramping mode is caused to be produced in or for the memory macro. The method then optionally continues at block 1710 where the first power ramping mode is caused to be produced in or for the memory macro. As described previously, in one embodiment, the second power ramping mode (block 1708) is the DL mode and the first power ramping mode (block 1710) is the DM mode. Alternatively, in another embodiment, the second power ramping mode (block 1708) is the DM mode and the first power ramping mode (block 1710) is the DL mode.

FIG. 17 describes the execution of only one power ramping mode (block 1704 or block 1708 performed), or the execution of the bi-directional power ramping mode where both blocks 1704 and 1706 are performed, or both blocks 1708 and 1710 are performed. As described earlier, the bi-directional power ramping mode combines two or more power ramping modes simultaneously. For example, the power management circuits shown in FIGS. 10-13 support a bi-directional power ramping mode that controls a first power ramping mode and a second power ramping mode simultaneously. In a non-limiting example, V1 ramps up before V2 ramps up and ramps down after V2 ramps down in the first power ramping mode (shown in FIG. 15). In the second power ramping mode, V2 ramps up before V1 ramps up and ramps down after V1 ramps down (shown in FIG. 16). Embodiments can cause the first power ramping mode to execute initially and the second power ramping mode to execute after the first power ramping mode, or the second power ramping mode to execute initially and the first power ramping mode to execute after the second power ramping mode.

Figure 18:
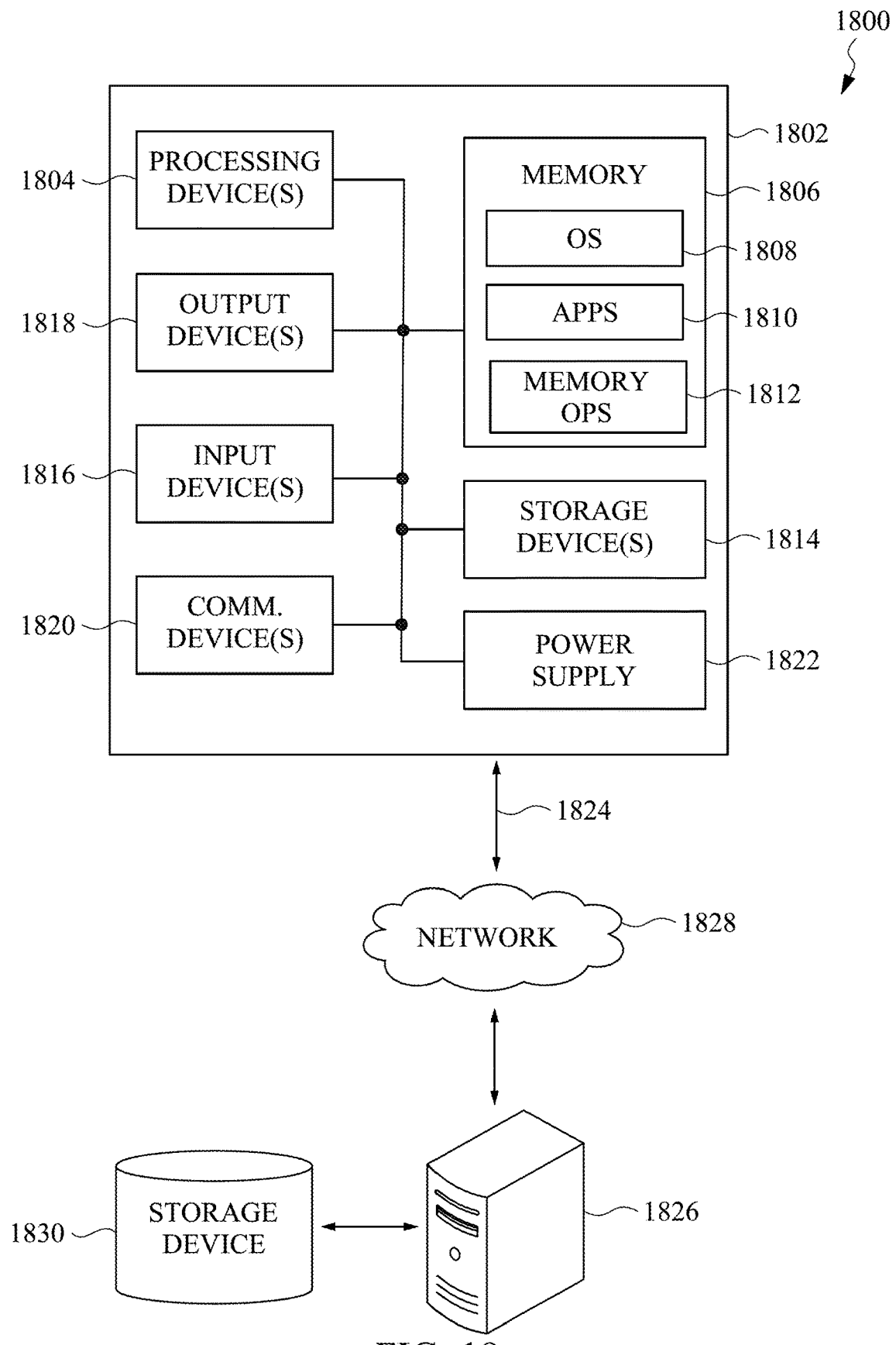
FIG. 18 illustrates an example system that can include one or more memory devices in accordance with some embodiments.

FIG. 18 illustrates an example system that can include one or more memory devices in accordance with some embodiments. The system 1800 includes an electronic device 1802. In an example configuration, the electronic device 1802 includes at least one processing device 1804 and at least one memory device 1806. The memory device(s) 1806 may include a number of data files and executable instructions of program modules, such as executable instructions associated with an operating system (OS) 1808, one or more software programs (APPS) 1810 suitable for parsing received input, determining subject matter of received input, determining actions associated with the input and so on, and memory operations 1812 for performing some or all of the memory operations disclosed herein. When executed by the processing device(s) 1804, the executable instructions may perform and/or cause to be performed processes including, but not limited to, the aspects as described herein. In one embodiment, the memory device(s) and/or the storage device(s) 1814 stores the one or more gating signals, the sleep signal(s), the shutdown signal, and/or the memory output signals.

The OS 1808, for example, may be suitable for controlling the operation of the electronic device 1802. Furthermore, embodiments may be practiced in conjunction with a graphics library, other operating systems, or any other application program and is not limited to any particular application or system.

The electronic device 1802 may have additional features or functionality. For example, the electronic device 1802 may also include additional removable and/or non-removable data storage devices 1814 such as, for example, magnetic disks, optical disks, tape, and/or memory cards or sticks. The memory device(s) 1806 and/or the data storage device(s) 1814 may be implemented as a memory device as disclosed herein. For example, the memory device(s) 1806 and/or the data storage device(s) 1814 can be an SRAM device.

The electronic device 1802 may also have one or more input devices 1816 and one or more output devices 1818. Example input device(s) 1816 include, but are not limited to, a keyboard, a trackpad, a mouse, a pen, a sound or voice input device, and/or a touch, force and/or swipe input device. The output device(s) 1818 can be one or more displays, one or more speakers, a printer, headphones, haptic or tactile feedback device, and the like. The electronic device 1802 may include one or more communication devices 1820 allowing communications with other electronic devices. Examples communication devices 1820 include, but are not limited to, radio frequency (RF) transmitter, receiver, and/or transceiver circuitry (e.g., WiFi), universal serial bus (USB), parallel and/or serial ports, cellular devices, near field communication devices, and short-range wireless devices.

The electronic device 1802 further includes a power supply 1822, which may be implemented as an external power source, such as an AC adapter. Additionally or alternatively, the power supply 1822 may include one or more batteries or a powered docking cradle that supplements or recharges the batteries.

The memory device(s) 1806 and the storage device(s) 1814 may include, but is not limited to, volatile storage (e.g., random access memory), non-volatile storage (e.g., read-only memory), flash memory, or any combination of such memories. For example, the memory device(s) 1806 and the storage device(s) 1814 can each be RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information, and which can be accessed by the electronic device 1802. In some instances, any such memory or storage device may be part of the electronic device 1802 or operably connected to the electronic device 1802.

Furthermore, embodiments may be practiced in an electrical circuit comprising discrete electronic elements, packaged or integrated electronic chips containing logic gates, a circuit utilizing a microprocessor, or on a single chip containing electronic elements or microprocessors. For example, embodiments of the disclosure may be practiced via a system-on-a-chip (SOC) where each or many of the components illustrated in FIG. 18 may be integrated onto a single integrated circuit. Such an SOC device may include one or more processing devices, graphics units, communications units, system virtualization units and various application functionality all of which are integrated (or "burned") onto the chip substrate as a single integrated circuit.

When operating via an SOC, the functionality, described herein, with respect to memory operations, may be operated via application-specific logic integrated with other components of the electronic device 1802 on the single integrated circuit (chip). Embodiments of the disclosure may also be practiced using other technologies capable of performing logical operations such as, for example, AND, OR, and NOT, including but not limited to mechanical, optical, fluidic, and quantum technologies. In addition, embodiments may be practiced within a general-purpose computer or in any other circuits or systems.

In some embodiments, the electronic device 1802 optionally accesses (optional connection and access indicated by dashed line 1824) one or more server-computing devices (represented by server-computing device 1826) through a wired and/or wireless connection to one or more networks (represented by network 1828). The server-computing device 1826 can interact with various programs or services stored on one or more storage devices (represented by storage device 1830) and executed by the server-computing device 1826.

In one or more embodiments, the network 1828 is illustrative of any type of network, for example, an intranet and/or a distributed computing network (e.g., the Internet). The electronic device 1802 can be a personal or handheld computing device or a desktop computing device. For example, the electronic device 1802 may be a smart phone, a tablet, a wearable device, a desktop computer, a laptop computer, and/or a server (individually or in combination). This list of electronic devices is for example purposes only and should not be considered as limiting.

Although the figures depict certain components, circuits, values, signal levels, and timing diagrams, other embodiments are not limited to these components, circuits values, signal levels, and timing diagrams. For example, FIGS. 4, 5, and 7 depict schematic diagrams of example level shifter circuits, and FIGS. 10-13 show schematic diagrams of example power management circuits. Other embodiments are not limited to these implementations of level shifter devices and/or power management circuits. The level shifter devices and/or the power management circuits can be constructed with different types of logic circuits, electrical circuits and/or components, and combinations thereof.

In one aspect, a device includes a memory macro and a level shifter device. The memory macro includes power management circuitry. The memory macro is configured to receive a first voltage signal and a second voltage signal. The level shifter device is configured to provide a third signal to the power management circuitry to control the first and the second voltage signals in the memory macro based on a fourth signal. When the fourth signal has a first logic state, the first voltage signal is ramped up before the second voltage signal is ramped up. When the fourth signal has a second logic state, the second voltage signal is ramped up before the first voltage signal is ramped up.

In another aspect, a memory macro is operably connected to a level shifter device. A method includes the level shifter device receiving a gating signal. Based on a signal level of the gating signal having a first logic state, causing a first power ramping mode in a plurality of power ramping modes to be produced in the memory macro. After the first power ramping mode is produced, causing a second power ramping mode in the plurality of power ramping modes to be produced in the memory macro.

In yet another aspect, an electronic device includes a power supply, a memory macro operably connected to the power supply, and a level shifter device operably connected to power management circuitry in the memory macro and to the power supply. The memory macro is configured to receive a first voltage signal and a second voltage signal. The power management circuitry is operable to cause the first and the second voltage signals to ramp up and ramp down according to at least one power ramping mode that is included in a plurality of power ramping modes. The level shifter device is operable to provide one or more signals to the power management circuitry that support the plurality of power ramping modes.

Aspects of the present disclosure, for example, are described above with reference to block diagrams and/or operational illustrations of methods, systems, and computer program products according to aspects of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a memory macro configured to receive a first voltage signal and a second voltage signal, the memory macro including power management circuitry; and
a level shifter device configured to provide a third signal to the power management circuitry to control the first and the second voltage signals in the memory macro based on a fourth signal, wherein:
the first voltage signal is ramped up before the second voltage signal is ramped up when the fourth signal has a first logic state; and
the second voltage signal is ramped up before the first voltage signal is ramped up when the fourth signal has a second logic state.

2. The device of claim 1, wherein the memory macro comprises a static random-access macro, the static random-access macro comprising a static random access memory array and periphery circuitry.

3. The device of claim 2, wherein the periphery circuitry comprises header circuits that are operably connected to respective power management circuits in the power management circuitry.

4. The device of claim 1, wherein the first voltage signal is a VDD voltage signal and the second voltage signal is a VDDM voltage signal.

5. The device of claim 1, wherein the level shifter device is configured to combine multiple power ramping modes simultaneously.

6. The device of claim 1, wherein the level shifter device is configured to produce a shutdown signal.

7. The device of claim 1, wherein the level shifter device is configured to produce a shutdown signal and a sleep signal.

8. The device of claim 1, wherein the level shifter device is configured to cause the first voltage signal to float in a bulk off mode.

9. The device of claim 1, wherein the level shifter device comprises four level shifter circuits, where one level shifter circuit outputs a shutdown signal and three level shifter circuits each output a sleep signal.

10. A method, comprising:
receiving, at a level shifter device operably connected to a memory macro, a gating signal;
based on a signal level of the gating signal having a first logic state:
causing a first power ramping mode in a plurality of power ramping modes to be produced in the memory macro; and
causing a second power ramping mode in the plurality of power ramping modes to be produced in the memory macro after the first power ramping mode;
wherein
the first power ramping mode ramps up a first voltage signal before a second voltage signal is ramped up and ramps down the second voltage signal before the first voltage signal is ramped down; and
the second power ramping mode ramps up the second voltage signal before the first voltage signal is ramped up and ramps down the first voltage signal before the second voltage signal is ramped down.

11. The method of claim 10, wherein:
the first power ramping mode ramps up a first voltage signal before a second voltage signal is ramped up; and
the second power ramping mode ramps up the second voltage signal before the first voltage signal is ramped up.

12. The method of claim 10, further comprising combining, by level shifter device, multiple power ramping modes simultaneously.

13. The method of claim 10, further comprising causing, by the level shifter device, the first voltage signal to float in a bulk off mode.

14. An electronic device, comprising:
a power supply;
a memory macro operably connected to the power supply and configured to receive a first voltage signal and a second voltage signal, the memory macro comprising power management circuitry operable to cause the first and the second voltage signals to ramp up and ramp down according to at least one power ramping mode that is included in a plurality of power ramping modes; and a level shifter device operably connected to the power management circuitry in the memory macro and to the power supply and configured to provide one or more signals to the power management circuitry that support the plurality of power ramping modes;

wherein:

the multiple power ramping modes comprise a first power ramping mode and a second power ramping mode;

the first power ramping mode causes a first voltage signal to ramp up before a second voltage signal is ramped up; and the second power ramping mode causes the second voltage signal to ramp up before the first voltage signal is ramped up.

15. The electronic device of claim 14, wherein the first voltage signal is a VDD voltage signal and the second voltage signal is a VDDM voltage signal.

16. The electronic device of claim 14, wherein the level shifter device is configured to support a bi-directional mode power ramping mode that combines the first and the second power ramping modes.

17. The electronic device of claim 14, wherein the memory macro comprises a static random-access macro.

18. The electronic device of claim 14, wherein the level shifter device comprises multiple level shifter circuits that produce a shutdown signal and one or more sleep signals.

19. The electronic device of claim 14, wherein the level shifter device is configured to produce at least one of a shutdown signal or a sleep signal.

20. The electronic device of claim 14, wherein the level shifter device is configured to cause the first voltage signal to float in a bulk off mode.

* * * * *